United States Patent
Liou et al.

(10) Patent No.: US 12,363,908 B2
(45) Date of Patent: *Jul. 15, 2025

(54) SEMICONDUCTOR MEMORY DEVICES WITH VARYING CHANNEL WIDTH AND METHODS OF MANUFACTURING THEREOF

(71) Applicant: Taiwan Semiconductor Manufacturing Company, Ltd., Hsinchu (TW)

(72) Inventors: Peng-Chun Liou, Hsinchu (TW); Zhiqiang Wu, Chubei (TW); Ya-Yun Cheng, Taichung (TW); Yi-Ching Liu, Hsinchu (TW); Meng-Han Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 97 days.

This patent is subject to a terminal disclaimer.

(21) Appl. No.: 18/361,270

(22) Filed: Jul. 28, 2023

(65) Prior Publication Data

US 2024/0023338 A1    Jan. 18, 2024

Related U.S. Application Data

(63) Continuation of application No. 17/458,692, filed on Aug. 27, 2021, now Pat. No. 11,758,734.

(Continued)

(51) Int. Cl.
*H10B 51/20* (2023.01)
*H10B 51/10* (2023.01)
*H10B 51/30* (2023.01)

(52) U.S. Cl.
CPC ............ *H10B 51/20* (2023.02); *H10B 51/10* (2023.02); *H10B 51/30* (2023.02)

(58) Field of Classification Search
CPC ........ H10B 51/00; H10B 51/10; H10B 51/20; H10B 51/30
See application file for complete search history.

(56) References Cited

U.S. PATENT DOCUMENTS

2010/0078701 A1* 4/2010 Shim ................. H10B 43/30
257/314
2013/0193395 A1* 8/2013 Lee ................... H10B 63/845
257/4

(Continued)

FOREIGN PATENT DOCUMENTS

CN   111146206 A   5/2020
CN   112470277     3/2021

(Continued)

OTHER PUBLICATIONS

Office Action issued in connection with Taiwan Appl. No. 111105691 dated Feb. 4, 2025.

*Primary Examiner* — Matthew E Warren
(74) *Attorney, Agent, or Firm* — FOLEY & LARDNER LLP

(57) ABSTRACT

A semiconductor device includes a first conductive structure extending along a vertical direction and a second conductive structure extending along the vertical direction. The second conductive structure is spaced apart from the first conductive structure along a first lateral direction. The semiconductor device includes third conductive structures each extending along the first lateral direction. The third conductive structures are disposed across the first and second conductive structures. The semiconductor device includes a first semiconductor channel extending along the vertical direction. The first semiconductor channel is disposed between the (Continued)

third conductive structures and the first conductive structure, and between the third conductive structures and the second conductive structure. The first and second conductive structures each have a first varying width along the first lateral direction, and the first semiconductor channel has a second varying width along a second lateral direction.

20 Claims, 32 Drawing Sheets

Related U.S. Application Data

(60) Provisional application No. 63/156,755, filed on Mar. 4, 2021.

(56) References Cited

U.S. PATENT DOCUMENTS

| | | |
|---|---|---|
| 2019/0027434 A1* | 1/2019 | Jung ............... H10B 43/35 |
| 2020/0312878 A1 | 10/2020 | Chang et al. |
| 2021/0065806 A1 | 3/2021 | Choi et al. |
| 2021/0143156 A1* | 5/2021 | Song ............... H10B 12/30 |
| 2022/0037350 A1* | 2/2022 | Billingsley ........... H10B 43/27 |

FOREIGN PATENT DOCUMENTS

| | | |
|---|---|---|
| TW | I717063 B | 1/2021 |
| WO | WO-2016/032838 A2 | 3/2016 |

* cited by examiner

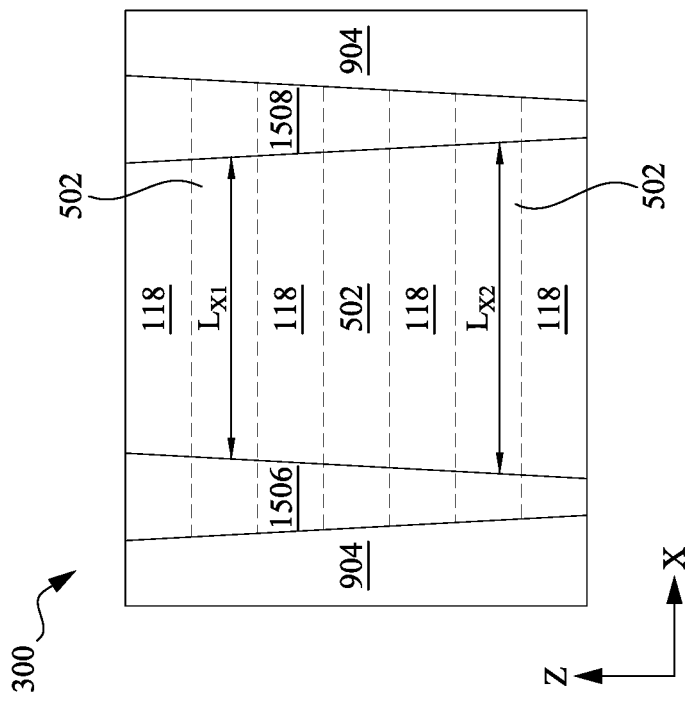
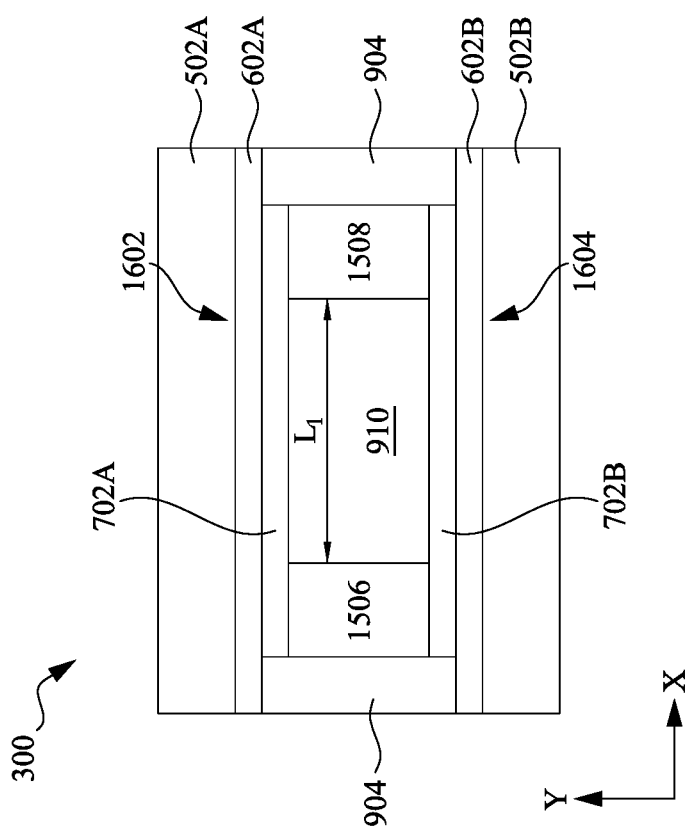
Fig. 15C
Fig. 15B

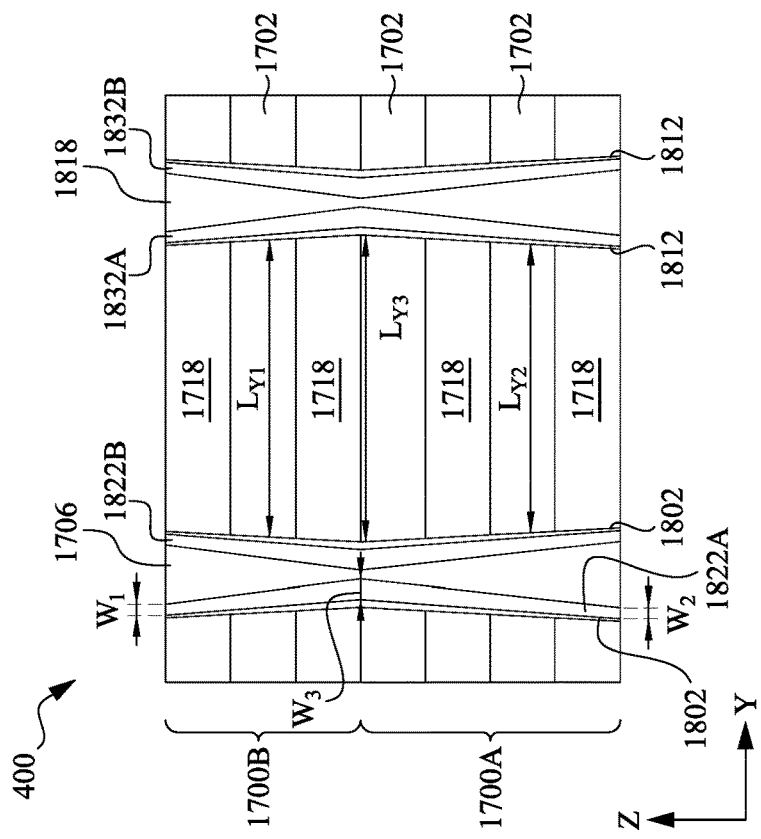
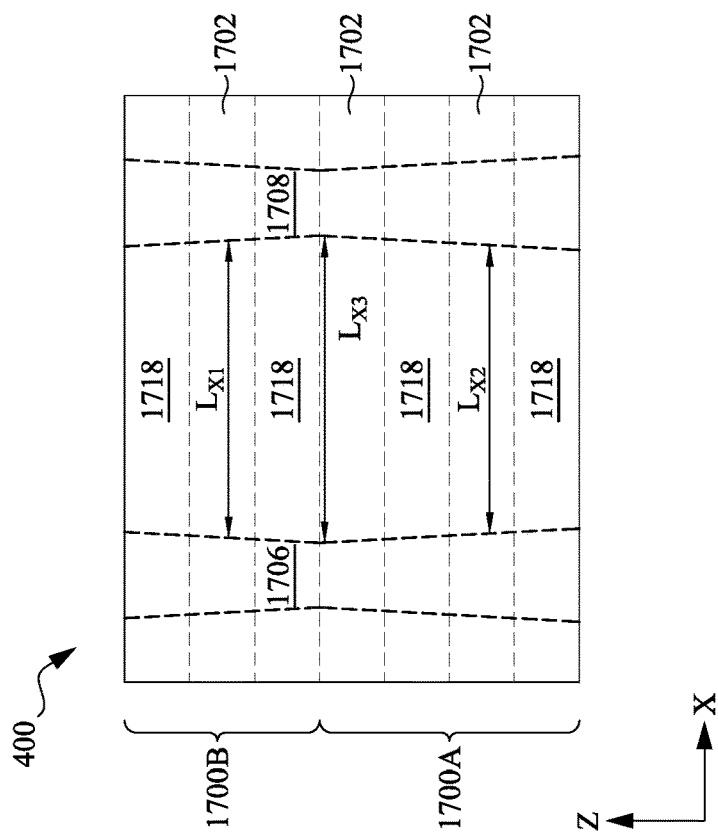
Fig. 17B
Fig. 17A

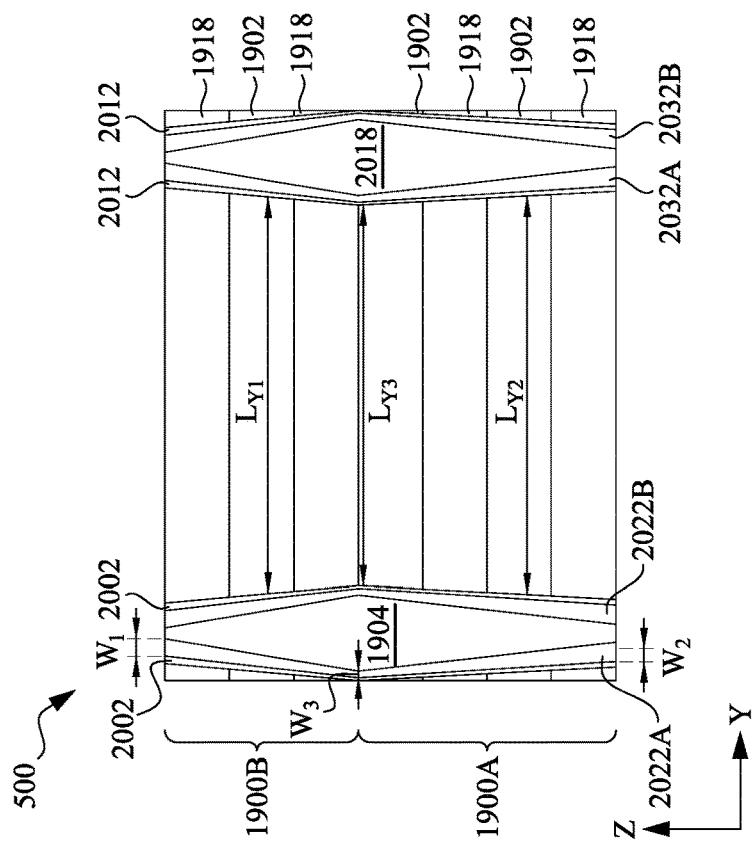
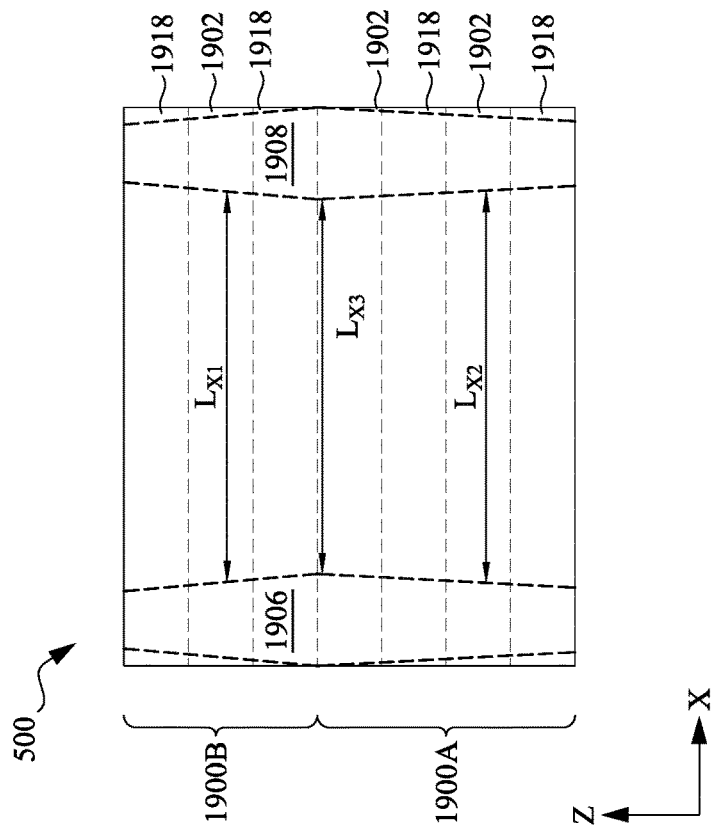
Fig. 19B
Fig. 19A

SEMICONDUCTOR MEMORY DEVICES WITH VARYING CHANNEL WIDTH AND METHODS OF MANUFACTURING THEREOF

CROSS-REFERENCE TO RELATED APPLICATION

This application is a Continuation of U.S. patent application Ser. No. 17/458,692, filed Aug. 27, 2021, which claims priority to and the benefit of U.S. Provisional Application No. 63/156,755, filed Mar. 4, 2021, each of which is incorporated herein by reference in its entirety for all purposes.

BACKGROUND

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15B, 15C, 15D illustrate a top view, a cross-sectional view cut along a first lateral cross-section (e.g., along the X-direction), and a cross-sectional view cut along a second lateral cross-section (e.g., along the Y-direction), respectively, of the example semiconductor device, in accordance with some embodiments.

FIGS. 17A-B illustrate cross-sectional views cut along a first lateral cross-section (e.g., along the X-direction) and a second lateral cross-section (e.g., along the Y-direction), respectively, of an example semiconductor device, in accordance with some embodiments.

FIGS. 19A-B illustrate cross-sectional views cut along a first lateral cross-section (e.g., along the X-direction) and a second lateral cross-section (e.g., along the Y-direction), respectively, of an example semiconductor device, in accordance with some embodiments.

DETAILED DESCRIPTION

Figure 1:
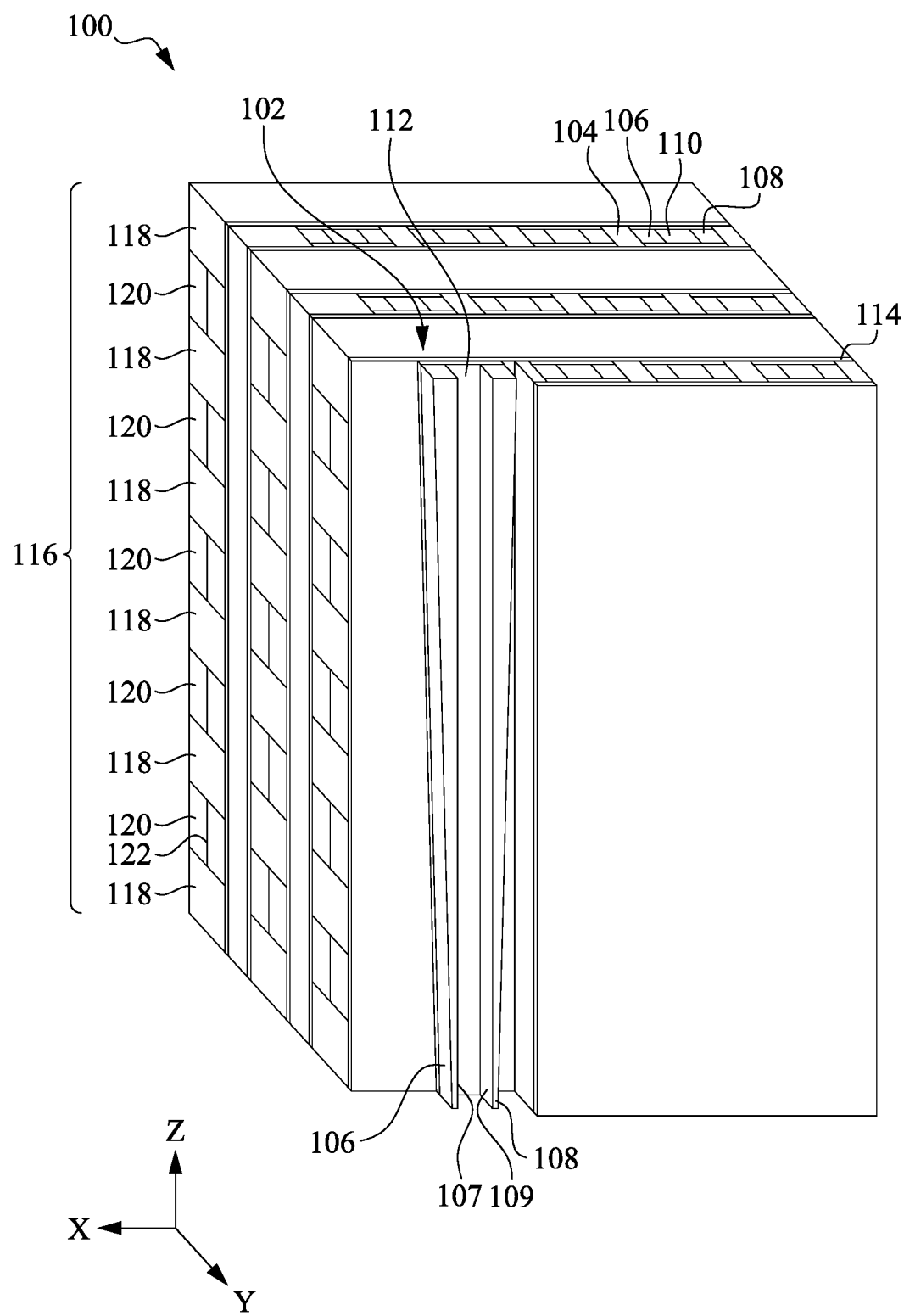
FIG. 1 is a perspective view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memories include an array of memory devices formed in a stack of insulating layers and gate layers, and may include a plurality of gate layers. The memory cells are formed across multiple memory levels (or tiers) over a substrate. For example, each memory cell can be constituted by at least one of: a portion of a semiconductor channel layer that continuously extends along a vertical direction of the array, a portion of a memory film that continuously extends along the vertical direction, a first conductive structure (functioning as a drain electrode) that continuously extends along the vertical direction, a second conductive structure (functioning as a source electrode) that continuously extends along the vertical direction, and one of a plurality of third conductive structures (functioning as gate electrodes) that continuously extend along a first lateral direction of the array. The drain electrode, source electrode, and gate electrode may sometimes be referred to as "bit line (BL)," "source/select line (SL), and "word line (WL)," respectively.

In some cases, the memory array can include a certain number of memory levels (e.g., about 16 memory levels), which causes the BLs/SLs to have a relatively high aspect ratio. With such a high aspect ratio, the BLs and SLs can be formed as having a tapered profile. Generally, the channel length of a memory cell is defined as the length of a portion of a semiconductor channel that is interposed between the BL and SL. Alternatively stated, the channel length may correspond to the distance separating respective (inner) sidewalls of the BL and the SL along a lateral direction. Because of the tapered profile of the BL and SL, the respective channel lengths of memory cells arranged along a vertical direction (which are sometimes referred to as a memory string) can vary. For example, when the BL and SL are formed to have a wider upper portion and a narrower lower portion, the channel length of a memory cell disposed at a lower level may be longer than the channel length of a memory cell disposed at a higher level. Such non-uniform (or otherwise varying) channel lengths can disadvantageously impact overall performance of the memory array. As the current level of each memory cell is generally proportional to its channel length, the varying channel lengths result in varying levels of cell current. For example, a longer (or longer than expected) channel length can lead to an undesired, insufficient cell current level, while a shorter (or shorter than expected) channel length can lead to an undesired, overwhelming cell current level.

Embodiments of the present disclosure are discussed in the context of forming a semiconductor device, and particularly in the context of forming a 3D memory device, that can compensate for varying cell currents. In accordance with various embodiments, even with the tapered profile of the BL and SL being formed which causes a varying channel length, the 3D memory device, as disclosed herein, includes a semiconductor channel that has a varying thickness to compensate for the varying channel length. For example, a lower cell current due to a longer channel length may be compensated by a thicker channel; and a higher cell current due to a shorter channel length may be compensated by a thinner channel. As such, the current levels of a number of memory cells (e.g., the memory cells of a memory string) can be adjusted to be uniform. Alternatively or additionally, by controlling the channel thicknesses, the current levels of memory cells can be accordingly modulated, as desired.

FIG. 1 illustrates a perspective views of a semiconductor device 100, in accordance with some embodiments. The semiconductor device 100 includes an array of memory cells 102. The semiconductor device may be disposed on a substrate (e.g., a silicon, or silicon on insulator (SOI) substrate) (not shown). When viewed from the top, such an array may be arranged in a column-row configuration, e.g., having a number of rows extending along a first lateral direction (e.g., the X-direction) and a number of columns extending along a second lateral direction (e.g., the Y-direction). Within each row, a number of memory cells 102 can be separated and electrically isolated from one another by an isolation structure 104. Each memory cell 102 can include a source line (SL) 106 and a bit line (BL) 108 separated and electrically isolated from each other by an inner spacer 110.

The semiconductor device 100 can include one or more semiconductor channels 112. The semiconductor channel 112, extending along the vertical direction (e.g., the Z-direction), can be disposed along each of the opposite surfaces (or sidewalls) of the SL 106 and BL 108 in the Y-direction, which may be better seen in the cut-out portion of FIG. 1. Each semiconductor channel 112 can extend in the first lateral direction (e.g., the X-direction), with itself physically separated or electrically isolated from another semiconductor channel 112 within the row (along the X-direction).

The semiconductor device 100 can include one or more memory films 114. The memory film 114, extending along the vertical direction (e.g., the Z-direction), can be disposed along a surface (or sidewall) of each semiconductor channel 112 opposite from the SL 106 and BL 108 in the Y-direction. The memory film 114 can extend in the first lateral direction (e.g., the X-direction).

In some embodiments, a number of memory cells 102 can be defined in the semiconductor device 100. A memory cell 102 can be constituted by a BL, a SL, a portion of a semiconductor channel, a portion of a memory film, and a word line (WL) (which will be discussed below). In the configuration of example FIG. 1, within one of the rows of the array, a number of memory cells 102 can be formed on the opposite sides of each pair of the BL and SL. For example, a first memory cell 102 can be partially defined by a portion of a memory film 114 and a portion of a semiconductor channel 112 disposed on one side of each pair of SL 106 and BL 108, and a second memory cell 102 can be partially defined by a portion of a memory fill 114 and a portion of a semiconductor channel 112 disposed on the other side of that pair of SL 106 and BL 108. Alternatively stated, these two memory cells 102 may share one pair of BL and SL. Further, each row can extend along the vertical direction (e.g., the Z-direction) to include an additional number of memory cells, thereby forming a number of memory strings. It should be understood that the semiconductor device 100 shown in FIG. 1 is merely an illustrative example, and thus, the semiconductor device 100 can be formed in any of various other 3D configurations, while remaining within the scope of present disclosure.

The semiconductor device 100 also includes a plurality of WLs 120 and a plurality of insulating layers 118 alternatively stacked on top of one another in the vertical direction (e.g., the Z-direction) which form a stack 116 disposed on outer surfaces of the memory film 114 (along the Y-direction), such that the stack 116 can be interposed between adjacent rows of memory cells 102. In some embodiments, a topmost layer and a bottommost layer of the stack 116 may include an insulating layer 118 of the plurality of insulating layers 118. The bottommost insulating layer 118 may be disposed on the substrate.

Each of the plurality of WLs 120 extends in semiconductor device 100 along the respective row of memory cells 102 along the first lateral direction (e.g. the X-direction). The insulating layers 118 may also extend along the first lateral direction (e.g., the X-direction). Two parallel WLs 120 may be located adjacent to each other in a second lateral direction that is perpendicular to the first lateral direction and in the same plane (e.g., the Y-direction), and may be interposed between two vertically separated insulating layers 118. In some embodiments, an adhesive layer 122 may be interposed between the WLs 120 and the adjacent insulating layers 118, and facilitate adhesion of the WL 120 to the insulating layer 118, and may also serve as a spacer between two parallel WLs 120 that are interposed between the same vertically separated insulating layers 118. In some embodiments, the adhesive layer 122 is optional.

As a representative example in FIG. 1, one of a number memory cells 102 can be defined by the SL 106, the BL 108, a portion of the semiconductor channel 112, a portion of the memory film 114, and one of the WLs 120. The SL 106 has an inner sidewall 107 and the BL 108 has an inner sidewall 109, a distance of which can define the channel length of such a memory cell. When the SL and the BL are formed in a tapered profile, as shown in FIG. 1, respective channel lengths of the memory cells arranged in the Z-direction may vary. In some embodiments, by controlling a thickness of the semiconductor channel 112 to vary in the Z-direction (i.e., the width of the semiconductor channel 112 in the Y-direction), the varying channel lengths of different memory cells can be compensated for more controllable overall performance of the semiconductor device 100.

Figure 2A:
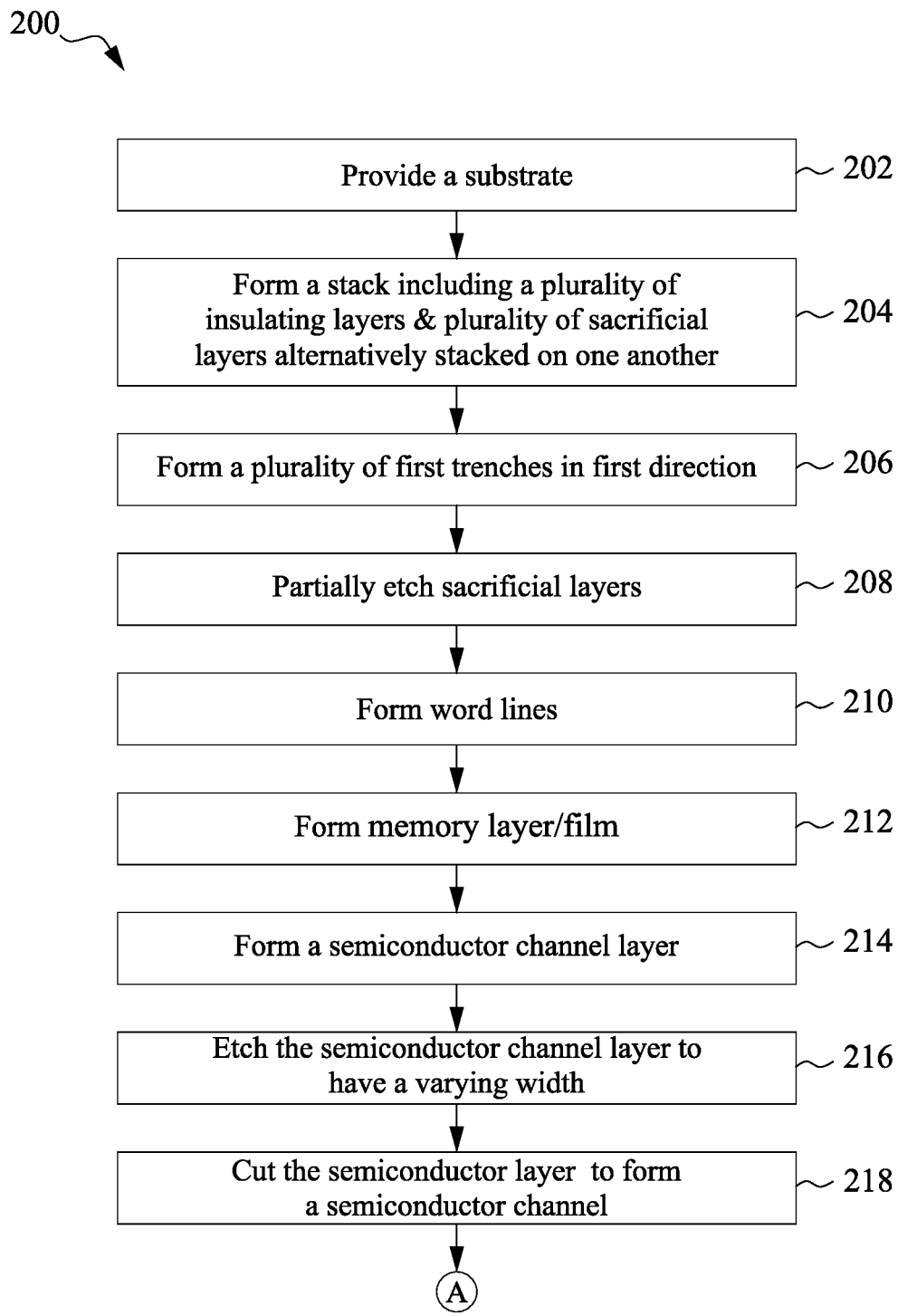
FIGS. 2A-B are an example flow chart of a method for forming a semiconductor device, in accordance with some embodiments.
Figure 2B:
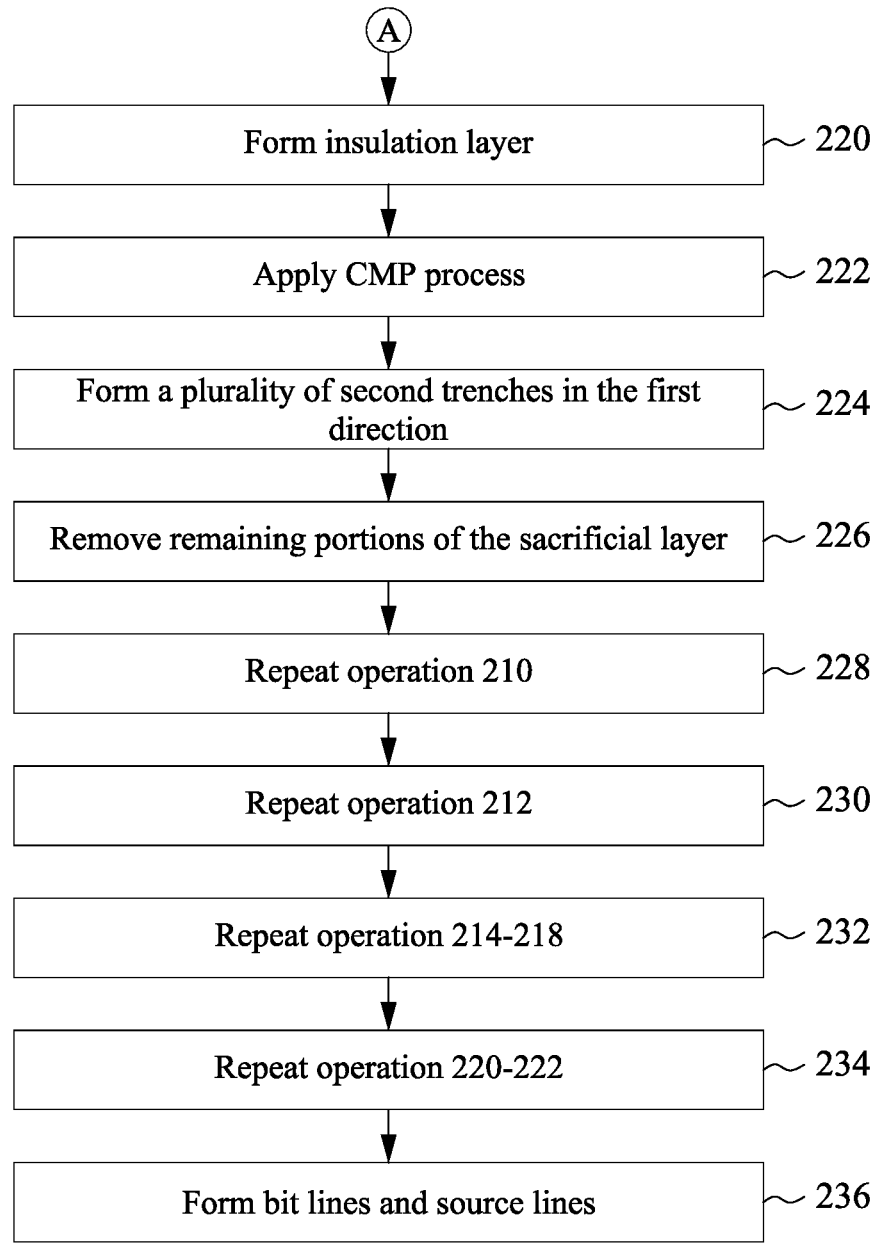

FIGS. 2A-2B illustrate a flowchart of an example method 200 for forming a semiconductor device 300, for example, a 3D memory device (e.g., the semiconductor device described with respect to FIG. 1), in accordance with some embodiments. It should be noted that the method 200 is merely an example, and is not intended to limit the present disclosure. Accordingly, it is understood that the order of operation of the method 200 of FIGS. 2A-B can change, that additional operations may be provided before, during, and after the method 200 of FIGS. 2A-B, and that some other operations may only be described briefly described herein.

In some embodiments, operations of the method 200 may be associated with perspective views of the example semiconductor device 300 at various fabrication stages as shown in FIGS. 3, 4, 5, 6, 7, 8, 9, 10, 11, 12, 13, 14, and 15A. In addition, the operations of the method 200 are equally applicable to any other semiconductor device, for example, a semiconductor device 400 shown in FIGS. 17A-B, a semiconductor device 500 shown in FIGS. 19A-B, or any other semiconductor device. Although FIGS. 3-15A illustrate the semiconductor device 300 including the plurality of memory cells 102, it should be understood the semiconductor device 300, 400, or 500 may include a number of other devices such as inductors, fuses, capacitors, coils, etc., which are not shown in FIGS. 3-19B, for purposes of clarity of illustration.

In a brief overview, the method 200 may start with the operation 202 in which a semiconductor substrate is provided. The method 200 continues to operation 204 in which a stack is provided wherein the stack comprises a plurality of insulating layers and a plurality of sacrificial layers alternatively stacked on top of each other. The method 200 continues to operation 206 in which a plurality of trenches extending in a first lateral direction (e.g., the X-direction) are formed. The method 200 continues to operation 208 in which the plurality of sacrificial layers are partially etched. The method 200 continues to operation 210 in which a plurality of word lines are formed. The method 200 continues to operation 212 in which a memory film or memory layer is formed. The method 200 continues to operation 214 in which a semiconductor channel layer is formed. The method 200 continues to operation 216 in which the semiconductor channel layer is etched to have a varying width. The method 200 continues to operation 218 in which the semiconductor channel layer is cut to form a semiconductor channel.

The method 200 continues to operation 220 in which an insulation layer is formed. The method 200 continues to operation 222 in which a chemical mechanical polish (CMP) process is applied which may remove any excess insulation material. The method 200 continues to operation 224 in which a plurality of second trenches are formed in the first lateral direction (e.g., the X-direction). The method 200 continues to operation 226 in which the remaining portions of the sacrificial layer are removed. The method 200 continues to operation 228 in which operation 210 (forming a plurality of word lines) is repeated. The method 200 continues to operation 230 in which operation 212 (forming a memory film or memory layer) is repeated. The method 200 continues to operation 232 in which the operations 214-218 (forming a semiconductor channel layer, etching the semiconductor channel layer to have a varying width, and cutting the semiconductor channel layer) are repeated. The method 200 continues to operation 234 in which the operations 220-222 (forming an insulation layer and applying a CMP process) are repeated. The method 200 continues to operation 236 in which bit lines and source lines are formed.

Figure 3:
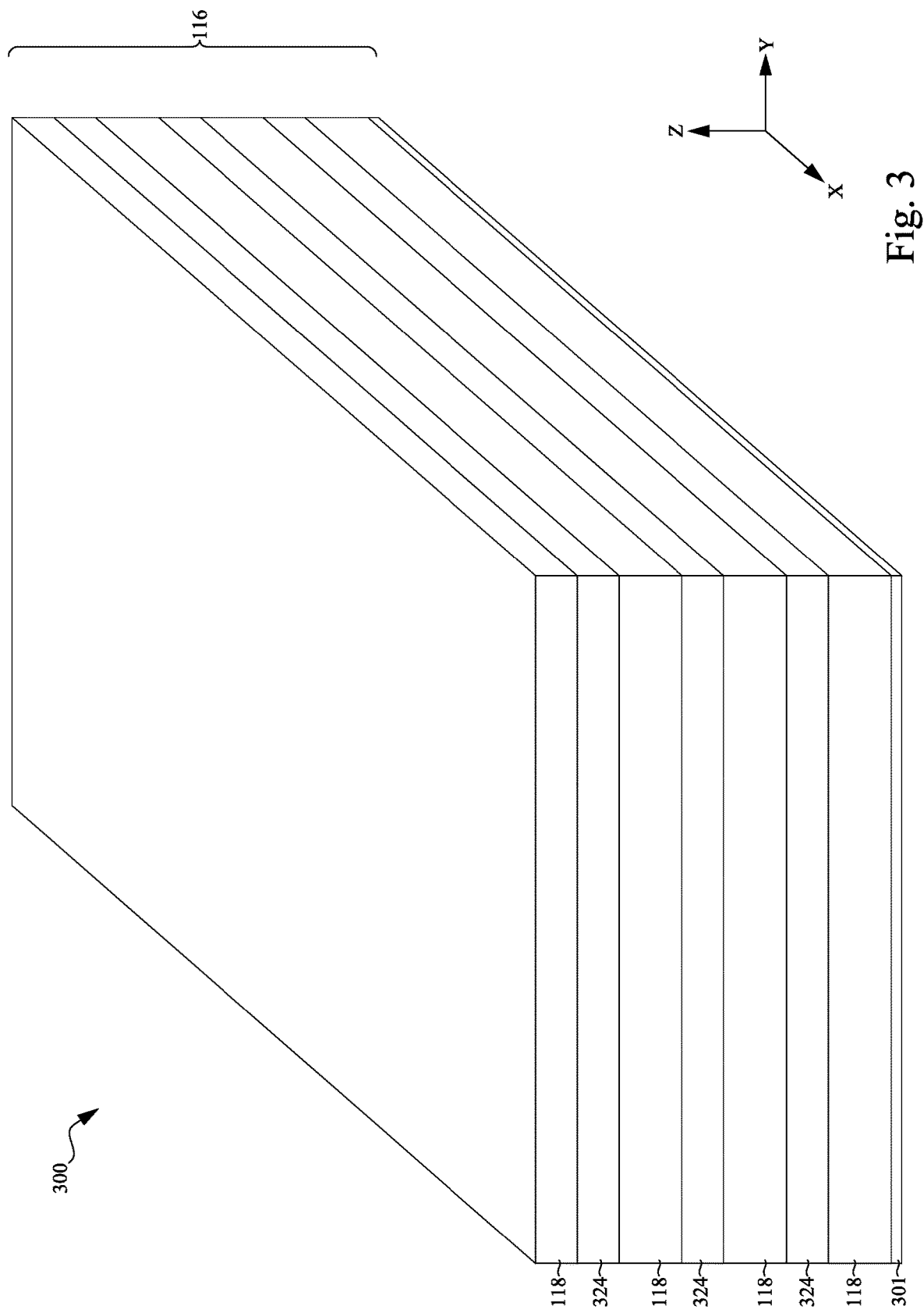
FIGS. 3, 4, 5, 6, 7, 8, 9, 10, 11, 12, 13, 14, and 15A illustrate perspective views of an example semiconductor device (or a portion of the example semiconductor device) during various fabrication stages, made by the method of FIGS. 2A-B, in accordance with some embodiments.

Corresponding to operations 202-204 of FIG. 2, FIG. 3 is a perspective view of a semiconductor device 300 including a substrate 301 and a stack 116, in accordance with some embodiments.

The substrate 301 may be a semiconductor substrate, such as a bulk semiconductor, a semiconductor-on-insulator (SOI) substrate, or the like, which may be doped (e.g., with a p-type or an n-type dopant) or undoped. The substrate 301 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate 301 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material, or combinations thereof.

The stack 116 is formed on the substrate 301. The stack includes a plurality of insulating layers 118 and a plurality of sacrificial layers 324 alternately stacked on top of each other in the vertical direction (e.g., the Z-direction). For example, one of the sacrificial layers 324 is disposed over one of the insulating layers 118, then another one of the insulating layers 118 is disposed on the sacrificial layer 324, so on and so forth. As shown in FIG. 3, a topmost layer (e.g., a layer distanced most from the substrate 301) and a bottommost layer (e.g., a layer most proximate to the substrate 301) of the stack 116 may include an insulating layer 118. While FIG. 3 shows the stack 116 as including 4 insulating layers 118 and 3 sacrificial layers 324, the stack 116 may include any number of insulating layers 118 and sacrificial layers 324 (e.g., 4, 5, 6, 7, 8, or even more). In various embodiments, if the number of sacrificial layers 324 in the stack 116 is n, a number of insulating layers 118 in the stack 116 may be n+1.

Each of the plurality of insulating layers 118 may have about the same thickness, for example, in a range of about 5 nm to about 100 nm, inclusive. Moreover, the sacrificial layers 324 may have the same thickness or different thickness from the insulating layers 118. The thickness of the sacrificial layers 324 may range from a few nanometers to few tens of nanometers (e.g., in a range of 5 nm to 100 nm, inclusive). In some embodiments, the thickness of the insulating layers 118 and the sacrificial layers 324 may include any other suitable thickness.

The insulating layers 118 and the sacrificial layers 324 have different compositions. In various embodiments, the insulating layers 118 and the sacrificial layers 324 have compositions that provide for different oxidation rates and/or different etch selectivity between the respective layers. The insulating materials that can be employed for the insulating layer 118 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other insulating materials are within the scope of the present disclosure. The sacrificial layers 324 may include an insulating material, a semiconductor material, or a conductive material. Non-limiting examples of the sacrificial layers 324 include silicon nitride, an amorphous semiconductor material (such as amorphous silicon), and a polycrystalline semiconductor material (such as polysilicon). In some embodiments, the insulating layers 118 may be formed from SiO, and the sacrificial layers 324 may be formed from SiN. The sacrificial layers 324 are merely spacer layers that are eventually removed and do not form an active component of the semiconductor device 300.

In various embodiments, the insulating layers 118 and/or the sacrificial layers 324 may be grown over the substrate 301. For example, each of the insulating layers 118 and the sacrificial layers 324 may be grown by a molecular beam epitaxy (MBE) process, a chemical vapor deposition (CVD) process such as a metal organic CVD (MOCVD) process, a furnace CVD process, an atomic layer deposition (ALD) process, and/or other suitable epitaxial growth processes. During the epitaxial growth, the crystal structure of the substrate 301 extends upwardly, resulting in the insulating layers 118 and the sacrificial layers 324 having the same crystal orientation as the substrate 301.

Figure 4:
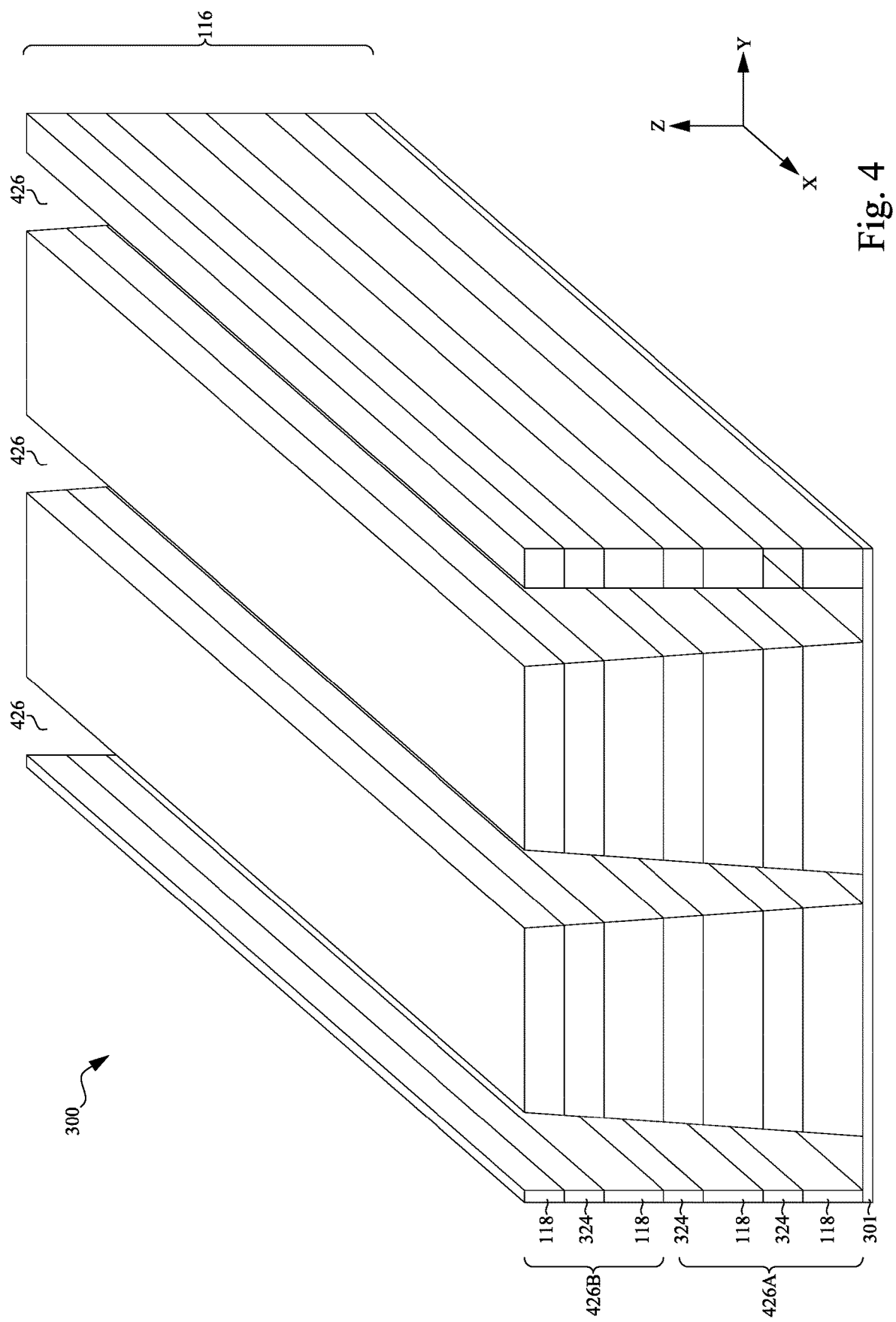

Corresponding to operation 206 of FIG. 2, FIG. 4 is a perspective view of a semiconductor device 300 with a plurality of first trenches formed through the stack extending in the X-direction, in accordance with some embodiments. Although three first trenches 426 are shown in the embodiment of FIG. 4, it should be understood that the semiconductor device 300 can include any numbers of first trenches 426, while remaining within the scope of the present disclosure.

The plurality of first trenches 426 extending in the X-direction, have been formed through the stack 116 up to the substrate 301 by etching the stack 116 in the Z-direction. The etching process for forming the plurality of first trenches 426 may include a plasma etching process, which can have a certain amount of anisotropic characteristic. For example, the first trenches 426 may be formed, for example, by depositing a photoresist or other masking layer on a top surface of the semiconductor device 300, i.e., the top surface of the topmost insulating layer 118 of the stack 116, and a pattern corresponding to the first trenches 426 defined in the masking layer (e.g., via photolithography, e-beam lithography, or any other suitable lithographic process).

The first trenches 426 may be formed using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first trenches 426.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 4, the etch used to form the plurality of first trenches 426 etches through each of the sacrificial layers 324 and insulating layers 118 of the stack 116 such that each of the plurality of first trenches 426 extend from the topmost insulating layer 118 through the bottommost insulating layer 118 to the substrate 301. In other embodiments, a hard mask may be used. In some embodiments, the first trenches 426 may be formed with a varying width along, the Y-direction. In some embodiments, the first trenches 426 may be etched with an increasing width as the height of first trench 426 increases in the Z-direction, as shown in FIG. 4. In some embodiments, the upper portion of the trench 426 may be exposed to more etchants in order to create the varying width.

In some embodiments, the first trenches 426 may have a first portion 426A and a second portion 426B along the Z-direction. In some embodiments, the width of the first trenches 426 may decrease along the first portion 426A and increase along the second portion 426B with an increasing height along the Z-direction. In some embodiments, the width of the first trenches 426 may increase along the first portion 426A and decrease along the second portion 426B with an increasing height along the Z-direction.

Figure 5:
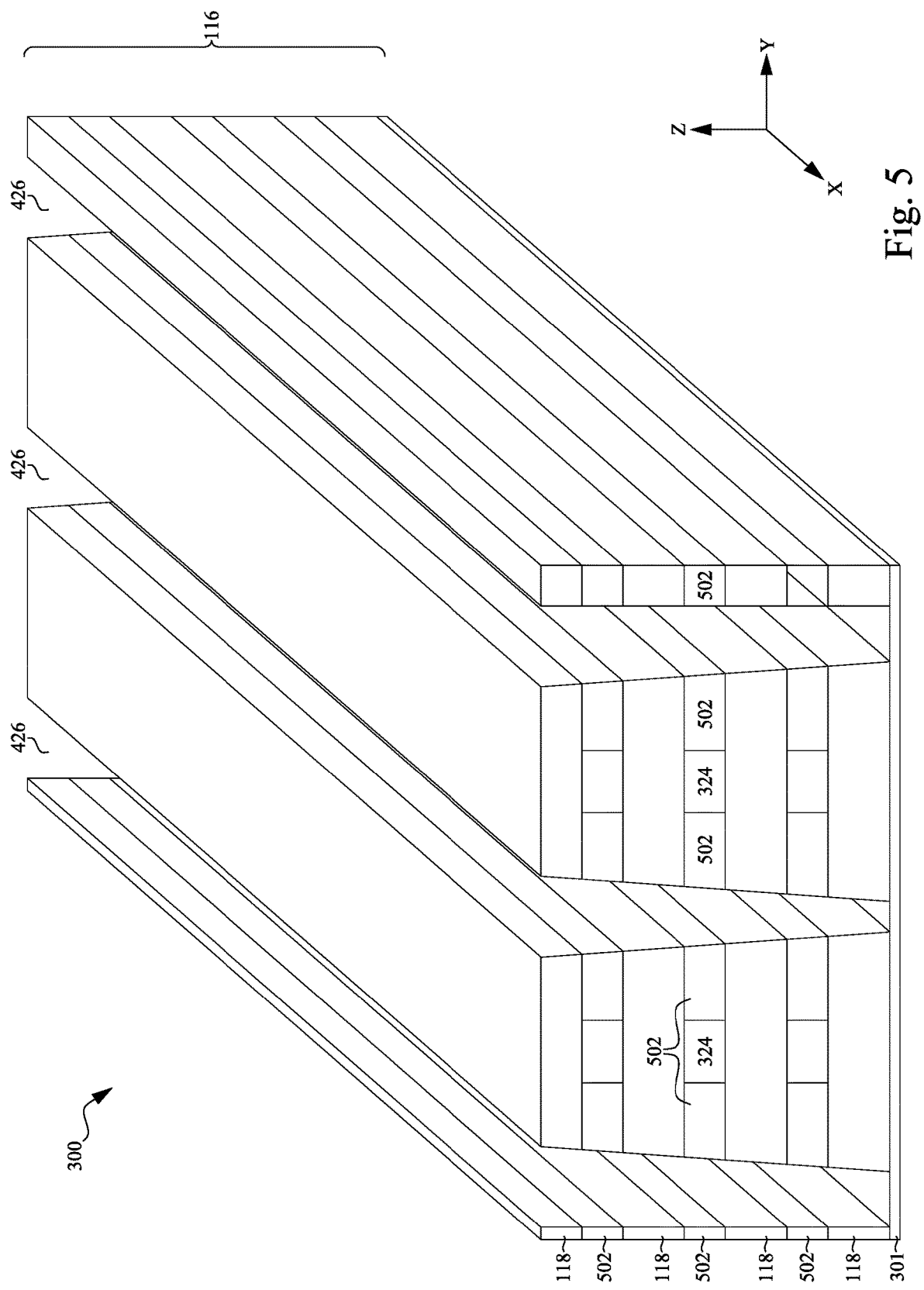

Corresponding to operations 208-210 of FIG. 2, FIG. 5 is a perspective view of a semiconductor device 300 with a plurality of word lines 502 formed after partially etching the sacrificial layers 324 within the first trenches 426, in accordance with some embodiments.

At operation 208, the exposed surfaces of the sacrificial layers 324 within the trenches are partially etched so as to reduce a width of the sacrificial layers relative to the insulating layers 118 in the stack 116 (not shown). The exposed surfaces extend in the X-direction, and etching the exposed surfaces of the sacrificial layers 324 reduces a width of the insulating layers 118 on either side of the sacrificial layers 324 in the Y-direction. In some embodiments, the sacrificial layers 324 may be etched using a wet etch process (e.g., hydrofluoric etch, buffered hydrofluoric acid). In other embodiments, the exposed surfaces of the sacrificial layers 324 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the sacrificial layers in the Y-direction reduces a width of the sacrificial layers 324 relative to the insulating layers 118 disposed in the stack 116 such that first cavities are formed whose boundaries are formed by top and bottom surfaces of adjacent insulating layers 118 and a surface of the partially etched sacrificial layers 324 that face the first trenches 426 and extend in the X-direction (not shown).

In some embodiments, an adhesive layer is then formed on sidewalls of the cavities (not shown). In some embodiments, the adhesive layer is optional. In various embodiments, the adhesive layers may include a material that has good adhesion with each of the insulating layers 118, the sacrificial layers 324, and the word lines 502, for example, Ti, Cr, etc. In some embodiments, the adhesive layer (e.g., the adhesive layer 122) may include e.g., titanium (Ti), chromium (Cr), or any other suitable adhesive material. The adhesive layers may be deposited using any suitable method including, for example, molecular beam deposition (MBD), atomic layer deposition (ALD), PECVD, and the like. In some embodiments, the adhesive layer may have a thickness in a range of 0.1 nm to 5 nm, inclusive or any other suitable thickness.

At operation 210, a plurality of word lines 502 (sometimes referred to as gate layers, conductive structures, or WLs) are formed in the first cavities located in the trenches. The exposed edges of the word lines may be etched back such that the edges of the word lines 502 facing the trenches are axially aligned in the Z-direction with corresponding edges of the insulating layers 118 disposed adjacent thereto, as shown in FIG. 5.

In various embodiments, the word lines 502 are formed by filling a gate metal in the cavities over the optional adhesive layer, such that the word lines 502 inherit the dimensions and profiles of the cavities. The word lines 502 can be formed by filling the first cavities with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The word lines 502 can be formed by overlaying the workpiece with the above-listed metal material by, for example, chemical vapor deposition (CVD), physical vapor deposition (PVD), electroless plating, electroplating, any other suitable process, or combinations thereof.

Although each word line 502 shown in FIG. 5 is shown as a single layer, the word line material may include a stack of multiple metal materials. For example, the word line material may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable processes.

Formation of the word lines 502 in the cavities may cause edges of the word lines 502 in the Y-direction to protrude outwards of the cavities, i.e., outwards of the corresponding edges of the insulating layers 118, and/or the material forming the word lines 502 may also be deposited on exposed surfaces of the insulating layers 118 that face the first trenches 426 and/or the substrate 301. The protruding edges of the word lines 502 are etched, for example, using a selective wet etching or dry etching process (e.g., RIE, DRIE, etc.) until any gate material deposited on the surfaces of the insulating layers 118 and/or the substrate 301, and edges of the word lines 502 facing the first trenches 426 are substantially axially aligned with corresponding edges of the insulating layers 118.

Figure 6:
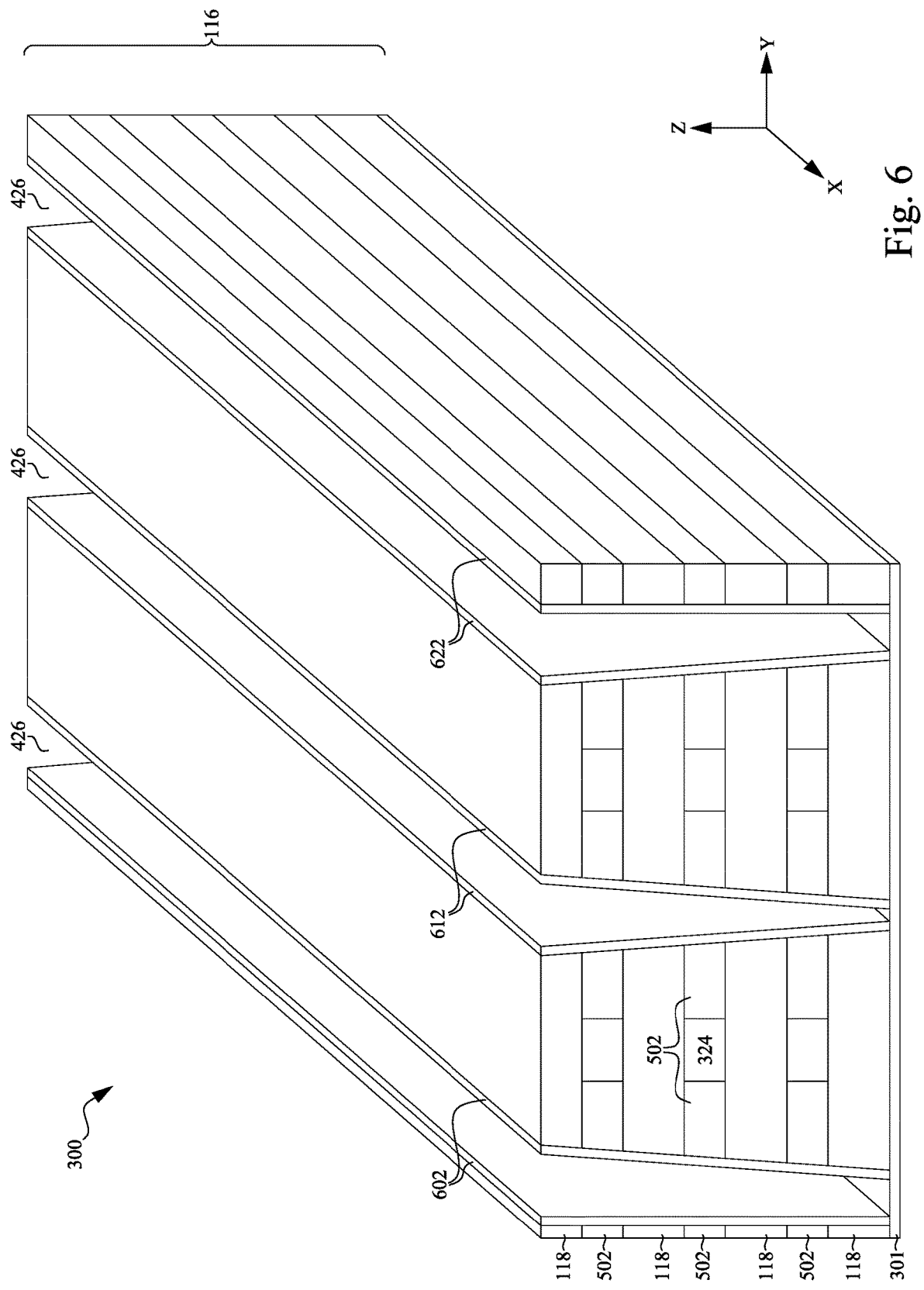

Corresponding to operations 212 of FIG. 2, FIG. 6 is a perspective view of a semiconductor device 300 in which memory layers 602, 612, and 622 are formed in each of plurality of first trenches 426 on exposed surfaces of the insulating layers 118 and the word lines 502 located in the first trenches 426, such that the memory layers 602-622 continuously extend along the X-direction, in accordance with some embodiments.

The memory layers 602-612 may include a ferroelectric material, for example, lead zirconate titanate (PZT), PbZr/$TiO_3$, $BaTiO_3$, $PbTiO_2$, or combinations thereof, etc. However, it should be understood that the memory layers 602-612 can include any of various other materials that are suitable as in memory devices, while remaining within the scope of the present disclosure. For example, the memory layers 602-612 can include a material selected from the group consisting of: $HfO_2$, $Hr_{1-x}Zr_xO_2$, $ZrO_2$, $TiO_2$, NiO, $TaO_x$, $Cu_2O$, $Nb_2O_5$, $AlO_x$, and combinations thereof. The memory layers 602-622 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layers 602-622 are continuous on the walls of the first trenches 426. In some embodiments, a CMP operation may be performed after forming the memory layers 602-622 so that they will lie in the same X-Y plane or are level with a top surface of the topmost insulating layer 118. After formation, the memory layers 602-622 may sometimes be referred to as memory films.

Figure 7:
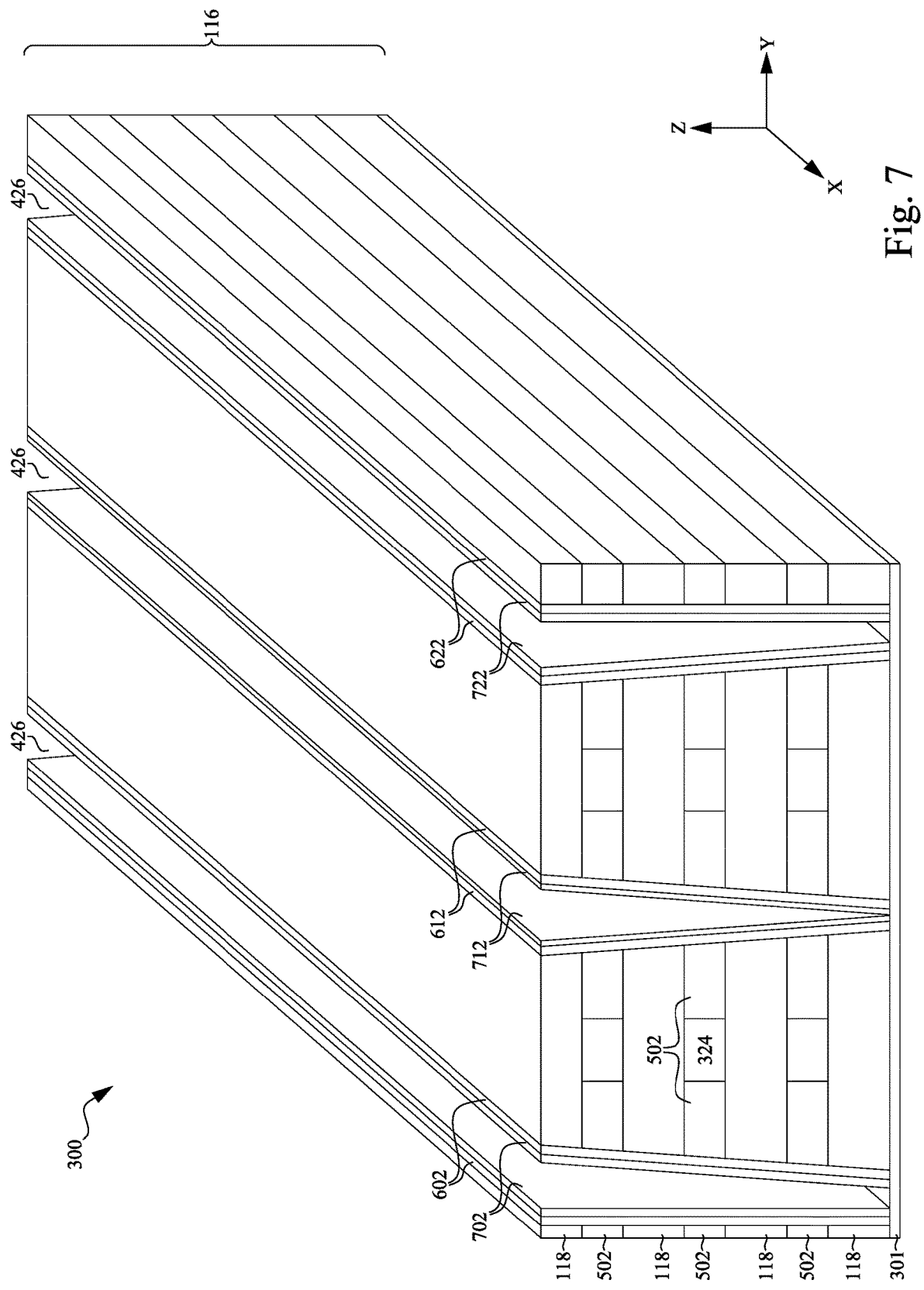

Corresponding to operations 214 of FIG. 2, FIG. 7 is a perspective view of a semiconductor device 300 in which semiconductor channel layers 702, 712, and 722 are formed within each of the plurality of first trenches 426 on exposed surfaces of the memory layers 602, 612, and 622, respectively, such that the semiconductor channel layers 702-722 also continuously extends along the X-direction in accordance with some embodiments.

In some embodiments, the semiconductor channel layers 702-722 may be formed from a semiconductor material, for example, Si (e.g., polysilicon or amorphous silicon); Ge; SiGe; a compound semiconductor including silicon carbide (SiC); gallium arsenic; gallium phosphide; indium phosphide; indium arsenide; indium antimonde; indium gallium zinc oxide (IGZO); indium tin oxide (ITO); indium zinc oxide (IZO); indium tungsten oxide (IWO); an alloy semiconductor including SiGe, GaAsP, AlInAs, AlGaAs, GaInAs, GaInP, and/or GaInAsP; any other suitable material, or combinations thereof. The semiconductor channel layers 702-722 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the semiconductor channel layers 702-722 are continuous on the inner surface of the memory layers 602-622, respectively. In some embodiments, a CMP operation may be performed after forming the semiconductor channel layers 702-722 so that they will lie in the same X-Y plane or are level with a top surface of the topmost insulating layer 118.

Figure 8:
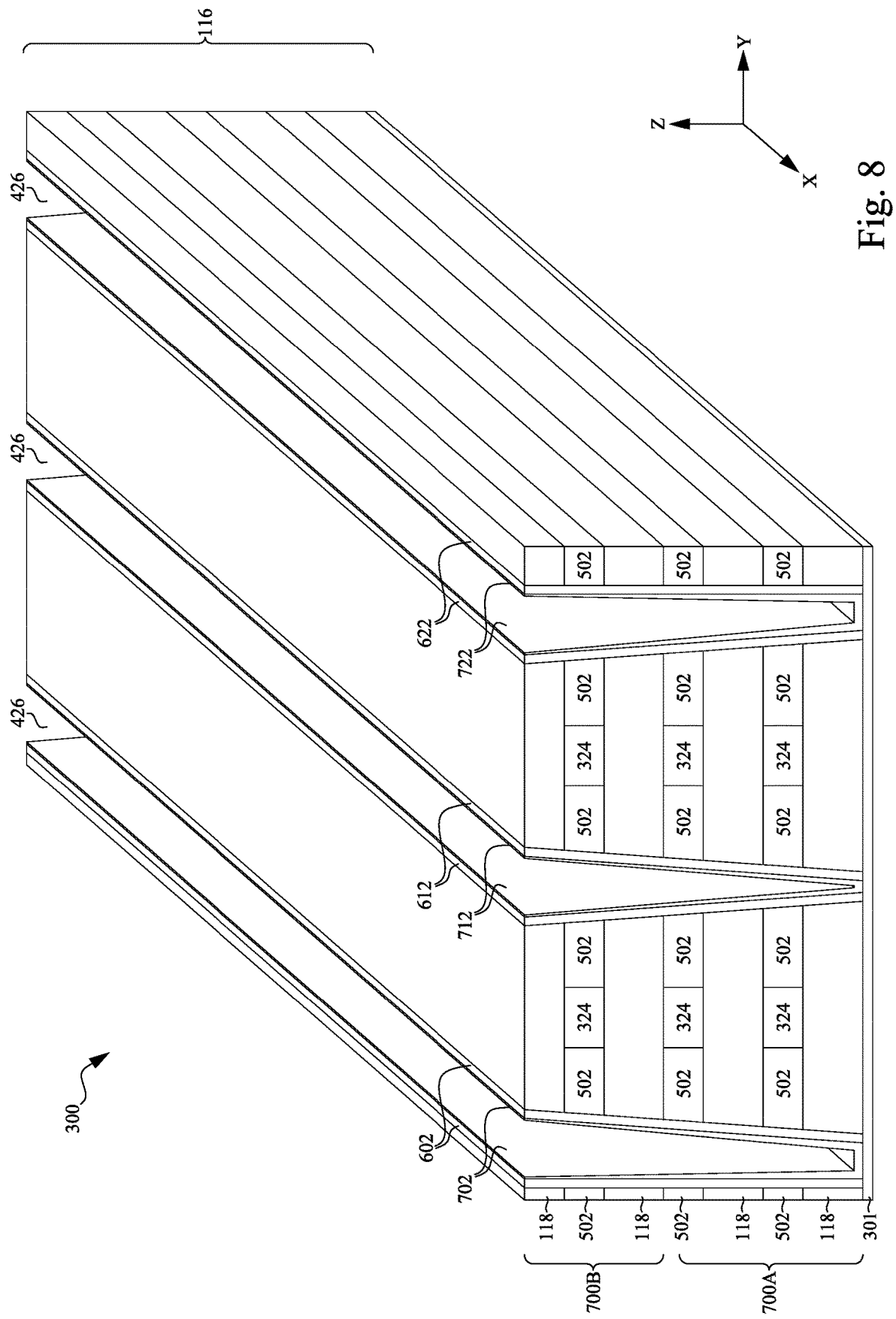

Corresponding to operation 216 of FIG. 2, FIG. 8 is a perspective view of a semiconductor device 300 in which the semiconductor channel layers 702-722 are patterned (e.g., etched) to have a varying width in the Y-direction with an increasing height in the Z-direction, in accordance with some embodiments.

The etching process for the semiconductor channel layers 702-722 may include a plasma etching process, which can have a certain amount of anisotropic characteristic. For example, semiconductor channel layers 702-722 may be formed, for example, by depositing a photoresist or other masking layer on a top surface of the semiconductor device 300, i.e., the top surface of the topmost insulating layer 118 of the stack 116, and a pattern corresponding to the semiconductor channel layers 702-722 defined in the masking layer (e.g., via photolithography, e-beam lithography, or any other suitable lithographic process).

The semiconductor channel layers 702-722 may be formed using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the semiconductor channel layers 702-722. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. In other embodiments, a hard mask may be used. The semiconductor channel layers 702-722 may be formed with a varying width along the Y-direction. In some embodiments, the semiconductor channel layers 702-722 may be etched with a decreasing width as the height increases in the Z-direction, as shown in FIG. 8. In some embodiments, the upper portion of the semiconductor channel layers 702-712 may be exposed to more etchants in order to create the varying width. The varying width of the semiconductor channel layers 702-712 prevents the degradation of the cell current along an increasing channel length.

In some embodiments, the semiconductor channel layers 702-722 may have a first portion 700A and a second portion 700B along the Z-direction. In some embodiments, the width of the semiconductor channel layers 702-722 may increase along the first portion 700A and decrease along the second portion 700B with an increasing height along the Z-direction. In some embodiments, the width of the semiconductor channel layers 702-722 may decrease along the first portion 700A and decrease along the second portion 700B with an increasing height along the Z-direction.

Figure 9:
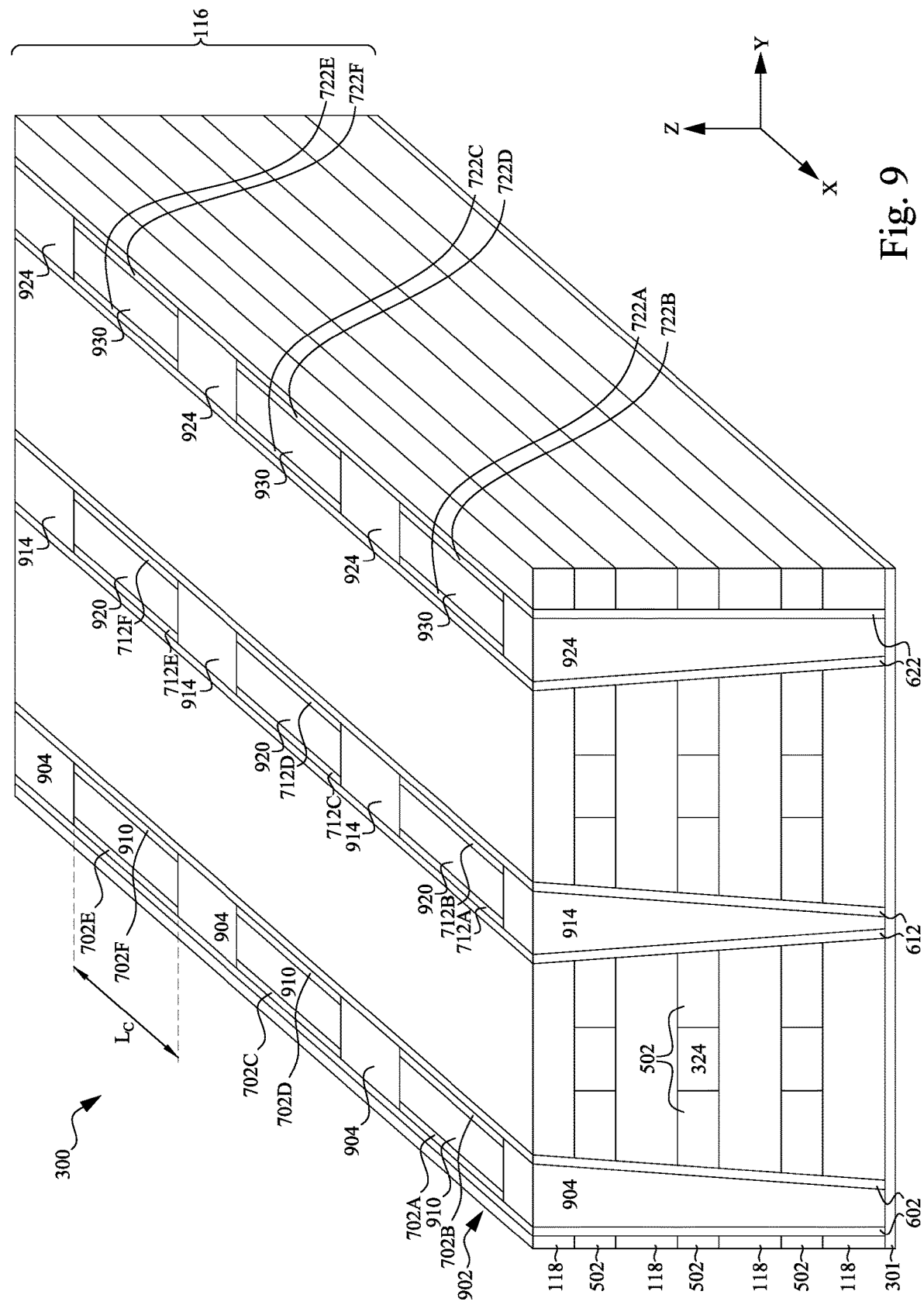

Corresponding to operations 218-222 of FIG. 2, FIG. 9 is a perspective view of a semiconductor device 300 in which the semiconductor channel layers 702-722 are cut along the X-direction to form semiconductor channels 702A-F, 712A-F, and 722A-F, respectively, and insulation layers are formed within each of the plurality of trenches, in accordance with some embodiments.

Corresponding to operation 218, the semiconductor channel layers 702-722 are patterned by, for example, an anisotropic etching process to form a number of portions. Other methods of patterning the semiconductor channel layers 702-722 are within the scope of the present disclosure. The semiconductor channel layer 702 is patterned to form a number of channel segments 702A, 702B, 702C, 702D, 702E, and 702F. The semiconductor channel layer 712 is patterned to form a number of channel segments 712A, 712B, 712C, 712D, 712E, and 712F. The channel layer 722 is patterned to form a number of channel segments 722A, 722B, 722C, 722D, 722E, and 722F. In various embodiments, each of the channel segments 702A-F, 712A-F, and 722A-F may extend along the X-direction with a length ($L_C$), which may be configured to define the physical channel length of a memory cell.

Corresponding to operation 220, insulation layers are formed within each of the plurality of trenches by filling each of the plurality of trenches with an insulating material such that a plurality of first device segments that include the memory layers 602-622, the semiconductor channels 702A-722F, and the insulation layers are formed in the semiconductor device, and extend in the first direction parallel to each other. The insulation layers form isolation structures 904, 914, and 924 as well as inner spacers 910, 920, and 930.

Each of the trenches is filled with an insulating material (e.g., $SiO_2$, SiN, SiON, SiCN, SiC, SiOC, SiOCN, the like, any other suitable material, or combinations thereof) so as to form the insulation layer. In some embodiments, the insulation layers may be formed from the same material as the plurality of insulating layers 118 (e.g., $SiO_2$). The insulation layer may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Thus, a plurality of partially-formed memory cells 902 that include the memory layers 602-622, the semiconductor channels 702A-722F, and the insulation layers are formed in the semiconductor device 300, and extend in the X-direction parallel to each other.

The cavities filled with the insulation layer in between the partially-formed memory cells 902 form the isolation structures 904, 914, and 924. The isolation structures 904-924 separate the semiconductor channels 702A-722F into portions such that the semiconductor channels 702A-722F are included in each memory cells 902.

As shown in FIG. 9, each partially-formed memory cell 902 includes an inner spacer 910, 920, or 930 formed from a portion of the insulation layer extending between adjacent isolation structures 904-924 in the X-direction, in accordance with some embodiments. The semiconductor channels 702A-722F are disposed on outer surfaces of the inner spacers 910-930 in the X-direction. Corresponding to operation 222, a CMP process may then be performed after forming the insulation layer so that it will lie in the same X-Y plane or are level with a top surface of the topmost insulating layer 118.

Figure 10:
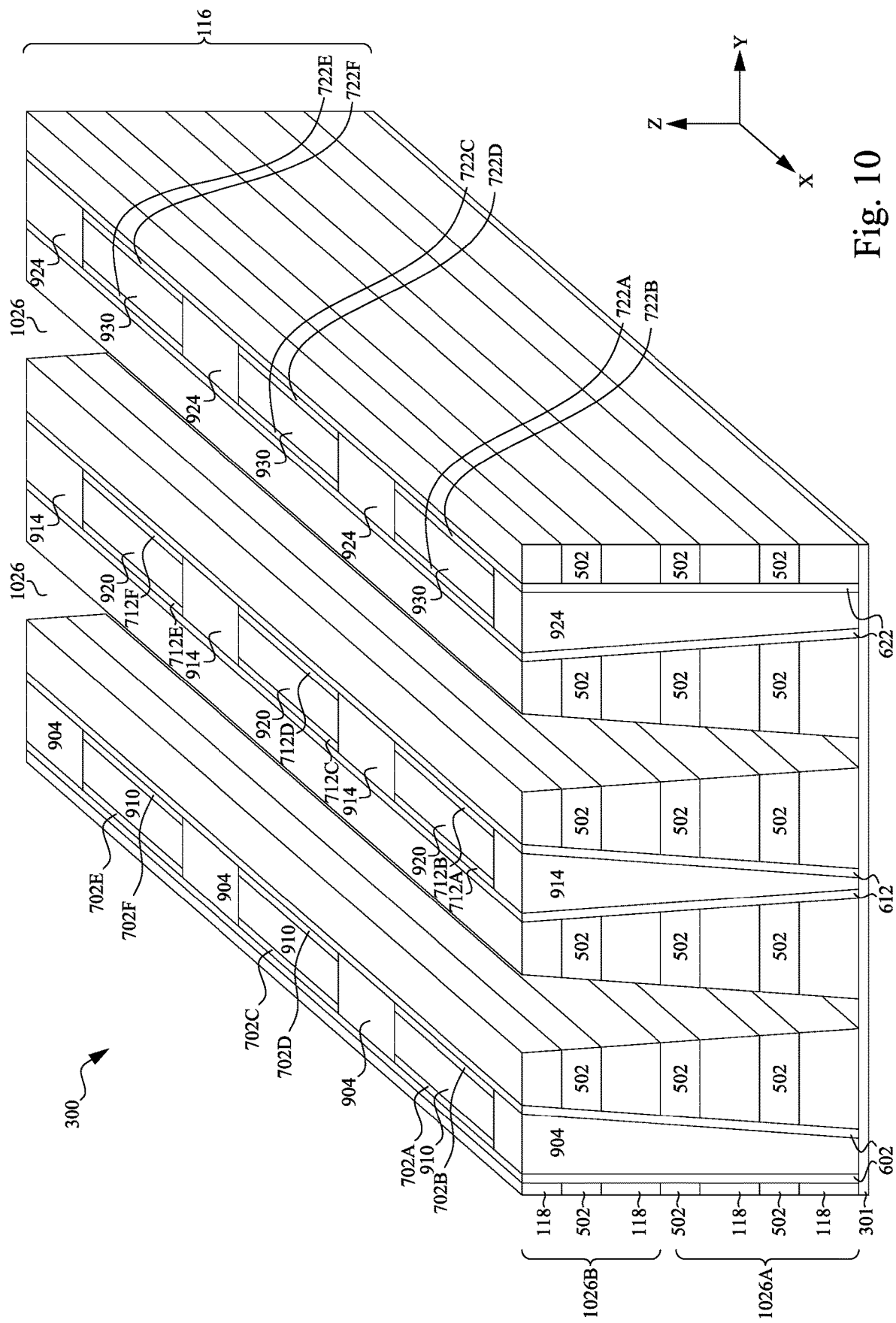

Corresponding to operations 224-228 of FIG. 2, FIG. 10 is a perspective view in which a plurality of second trenches 1026 are formed between each of the first device segments such that the plurality of second trenches 1026 also continuously extends in the X-direction and the remaining portions of the sacrificial layers 324 are etched to form a second set of word lines 502 in accordance with some embodiments.

As with the first trenches 426, the second trenches 1026 are formed by etching the stack 116 in the Z-direction to the substrate 301. FIG. 10 depicts that two second trenches 1026 are formed, but it is understood that any number of second trenches can be formed (e.g., 2, 3, 4, 6, 7, 8, 9, or 10 trenches). In some embodiments, the number of second trenches formed may be one less than the number of first trenches.

The plurality of second trenches 1026 may be formed using the same process used to form the plurality of first trenches 426. For example, the second trenches 1026 may be formed, for example, by depositing a photoresist or other masking layer on a top surface of the semiconductor device 300, i.e., the top surface of the topmost insulating layer 118 of the stack 116, and a pattern corresponding to the second trenches 1026 defined in the masking layer (e.g., via photolithography, e-beam lithography, or any other suitable lithographic process). In other embodiments, a hard mask may be used. Subsequently, semiconductor device 300 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 1026. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 10, the etch used to form the plurality of second trenches 1026 etches through each of the sacrificial layers 324 and insulating layers 118 of the stack 116 such that each of the plurality of second trenches 1026 extend from the topmost insulating layer 118 through the bottommost insulating layer 118 to the substrate 301. In some embodiments, the second trenches 1026 may be etched with an increasing width as the height of second trenches 1026 increases in the Z-direction, as shown in FIG. 10. In some embodiments, the upper portion of the second trenches 1026 may be exposed to more etchants in order to create the varying width.

In some embodiments, the second trenches 1026 may have a first portion 1026A and a second portion 1026B along the Z-direction. In some embodiments, the width of the second trenches 1026 may decrease along the first portion 1026A and increase along the second portion 1026B with an increasing height along the Z-direction. In some embodiments, the width of the second trenches 1026 may increase along the first portion 1026A and decrease along the second portion 1026B with an increasing height along the Z-direction.

Corresponding to operation 226, the remaining portions of the sacrificial layers 324 are removed so as to form cavities between the insulating layers 118 adjacent to the previously formed word lines 502 (not shown). A second set of adhesive layers are optionally formed and word lines 502 are formed adjacent to the previously formed word lines 502. FIG. 10 is a perspective view of the semiconductor device 300 after forming a second set of word lines 502 adjacent to the previously formed word lines 502. The remaining portions of the sacrificial layers 324 may be etched using the same process as described by etching exposed portions of the sacrificial layers 324 in the second trenches 1026 until the sacrificial layers 324 are completely removed. This leaves cavities between adjacent layers of insulating layers 118 and adjacent to the word lines 502. Optionally, an adhesive layer is deposited on walls of the newly formed cavities. Corresponding to operation 228, a word line 502 material is then deposited in the cavities so as to fill the cavities to form a second set of word lines 502 adjacent to the previously formed word lines 502 such that the two word lines 502 are disposed next to each other with the adhesive layer disposed therebetween. The second set of word lines 502 may be etched back such that edges of the second set of word lines 502 facing the second trenches 1026 are substantially axially aligned with corresponding edges of the insulating layers 118.

The word lines 502 can be formed by filling the first cavities with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, any other suitable material or combinations thereof. Other metal materials are within the scope of the present disclosure. The word lines 502 can be formed by overlaying the workpiece with the above-listed metal material by, for example, chemical vapor deposition (CVD), physical vapor deposition (PVD), electroless plating, electroplating, or combinations thereof.

Although each word line 502 is shown as a single layer, the word line material may include a stack of multiple metal materials. For example, the word line material may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable processes.

Figure 11:
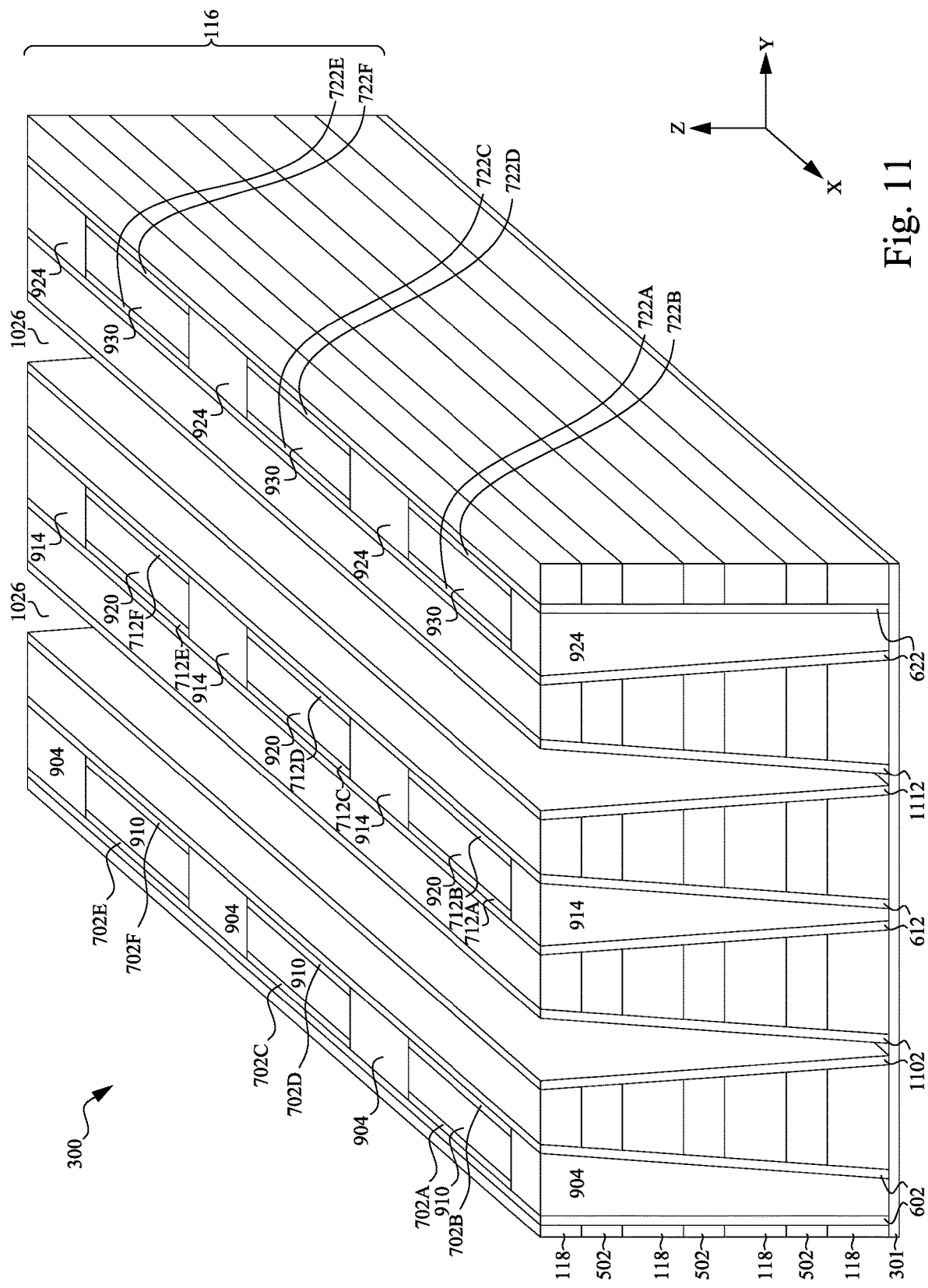

Corresponding to operation 230 of FIG. 2, FIG. 11 is a perspective view of the semiconductor device 300 in which a second set of memory layers 1102 and 1112 are formed in each of the second trenches 1026 on exposed surfaces of the insulating layers 118 and the word lines 502 located in the second trenches 1026, such that the memory layers 1102 and 1112 continuously extend along the X-direction, in accordance with some embodiments.

The second set of memory layers 1102 and 1112 are substantially similar to the memory layers 602-612. The memory layers 1102 and 1112 may include a ferroelectric material, for example, lead zirconate titanate (PZT), PbZr/$TiO_3$, $BaTiO_3$, $PbTiO_2$, etc. However, it should be understood that the memory layers 1102 and 1112 can include any of various other materials that are suitable as in memory devices, while remaining within the scope of the present disclosure. For example, the memory layers 1102 and 1112 can include a material selected from the group consisting of:

$HfO_2$, $Hr_{1-x}Zr_xO_2$, $ZrO_2$, $TiO_2$, NiO, $TaO_x$, $Cu_2O$, $Nb_2O_5$, $AlO_x$, any other suitable material, or combinations thereof. The memory layers 1102 and 1112 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layers 1102 and 1112 are continuous on the walls of the second trenches 1026. In some embodiments, a CMP operation may be performed after forming the memory layers 1102 and 1112 so that they will lie in the same X-Y plane or are level with a top surface of the topmost insulating layer 118. After formation, memory layers 1102 and 1112 are sometimes referred to as memory films.

Corresponding to operation 232 of FIG. 2, FIGS. 12-14 are perspective views of the semiconductor device 300 in which a second set of semiconductor channel layers 1202 and 1212 are formed, the semiconductor channel layers 1202 and 1212 are etched to have a varying width, and the semiconductor channel layers 1202 and 1212 are cut to form a semiconductor channel, respectively, in accordance with some embodiments.

Figure 12:
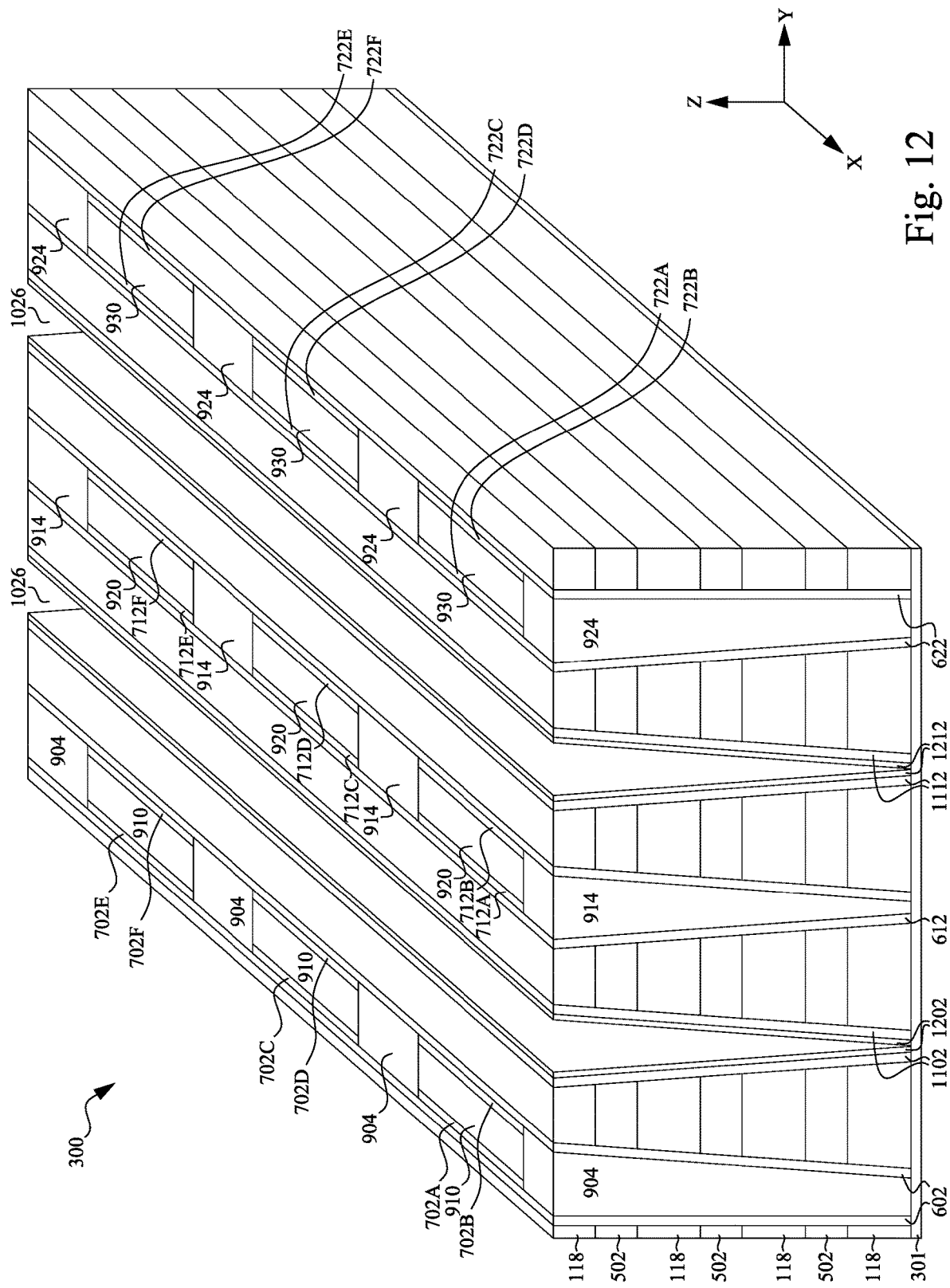

FIG. 12 illustrates a perspective view of semiconductor device 300 in which a second set of semiconductor channel layers 1202 and 1212 are formed within each of the plurality of second trenches 1026 on exposed surfaces of the memory layers 1102 and 11112, respectively, such that the semiconductor channel layers 1202 and 1212 also continuously extend along the X-direction, in accordance with some embodiments.

The second set of semiconductor channel layers 1202 and 1212 are substantially similar to the semiconductor channel layers 702, 712, and 722. In some embodiments, the semiconductor channel layers 1202 and 1212 may be formed from a semiconductor material, for example, Si (e.g., polysilicon or amorphous silicon), Ge, SiGe, silicon carbide (SiC), indium gallium zinc oxide (IGZO), indium tin oxide (ITO), indium zinc oxide (IZO), indium tungsten oxide (IWO), any other suitable material, or combinations thereof. The semiconductor channel layers 1202 and 1212 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the semiconductor channel layers 1202 and 1212 are continuous on the inner surface of the memory layers 1102 and 1112, respectively. In some embodiments, a CMP operation may be performed after forming the semiconductor channel layers 1202 and 1212 so that they will lie in the same X-Y plane or are level with a top surface of the topmost insulating layer 118.

Figure 13:
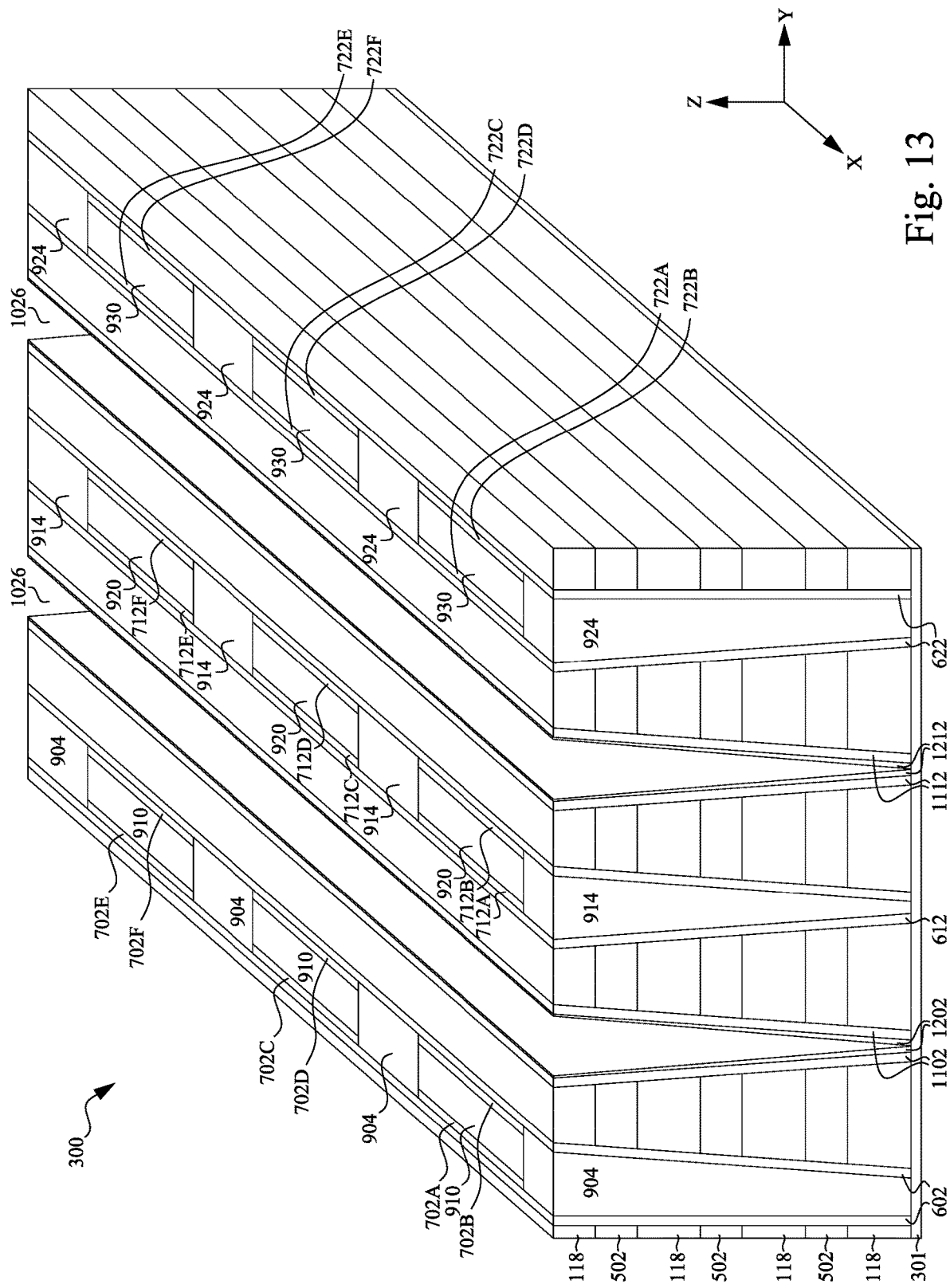

FIG. 13 illustrates a perspective view of semiconductor device 300 in which semiconductor channel layers 1202 and 1212 are etched to have a varying width with an increasing height the Z-direction, in accordance with some embodiments.

The etching process for the semiconductor channel layers 1202 and 1212 may include a plasma etching process, which can have a certain amount of anisotropic characteristic. For example, the semiconductor channel layers 1202 and 1212 may be formed, for example, by depositing a photoresist or other masking layer on a top surface of the semiconductor device 300, i.e., the top surface of the topmost insulating layer 118 of the stack 116, and a pattern corresponding to the semiconductor channel layers 1202 and 1212 defined in the masking layer (e.g., via photolithography, e-beam lithography, or any other suitable lithographic process).

The semiconductor channel layers 1202 and 1212 may be formed using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the semiconductor channel layers 1202 and 1212. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. In other embodiments, a hard mask may be used. The semiconductor channel layers 1202 and 1212 may be formed with a varying width along the Y-direction. In some embodiments, the semiconductor channel layers 1202 and 1212 may be etched with a decreasing width as the height increases in the Z-direction, as shown in FIG. 13. In some embodiments, the upper portion of the semiconductor channel layers 1202 and 1212 may be exposed to more etchants in order to create the varying width. The varying width of the semiconductor channel layers 1202 and 1212 compensates for a more controllable cell current and overall performance of the semiconductor device 300.

In some embodiments, the semiconductor channel layers 1202 and 1212 may have a first portion 1200A and a second portion 1200B along the Z-direction. In some embodiments, the width of the semiconductor channel layers 1202 and 1212 may increase along the first portion 1200A and decrease along the second portion 1200B with an increasing height along the Z-direction. In some embodiments, the width of the semiconductor channel layers 1202 and 1212 may decrease along the first portion 1200A and decrease along the second portion 1200B with an increasing height along the Z-direction.

Figure 14:
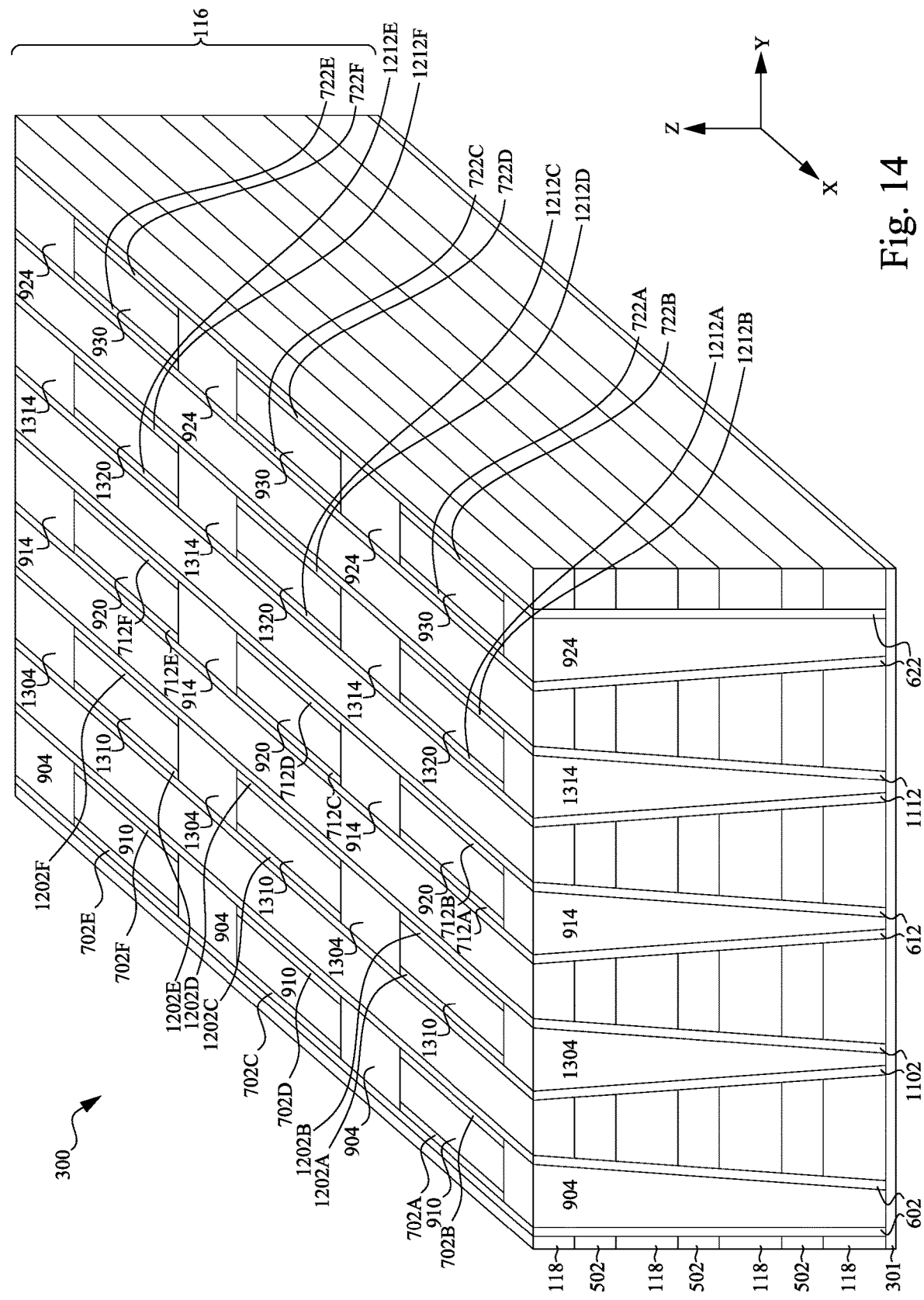

FIG. 14 is a perspective view of a semiconductor device 300 in which the semiconductor channel layers 1202 and 1212 are cut along the X-direction to form a semiconductor channel segments 1202A-F and 1212A-F, respectively, and insulation layers are formed within each of the plurality of trenches, in accordance with some embodiments.

The semiconductor channel layers 1202 and 1212 are patterned by, for example, an anisotropic etching process to form a number of portions. Other methods of patterning the semiconductor channel layers 1202 and 1212 are within the scope of the present disclosure. The semiconductor channel layer 1202 is patterned to form a number of channel segments 1202A, 1202B, 1202C, 1202D, 1202E, and 1202F. The semiconductor channel layer 1212 is patterned to form a number of channel segments 1212A, 1212B, 1212C, 1212D, 1212E, and 1212F. In various embodiments, each of the channel segments 1202A-F and 1212A-F may extend along the X-direction with a length ($L_C$), which may be configured to define the physical channel length of a memory cell.

Then, insulation layers are formed within each of the plurality of trenches by filling each of the plurality of trenches with an insulating material such that a plurality of first device segments that include the memory layers 1102 and 1112, the semiconductor channels 1202A-1212C, and the insulation layers are formed in the semiconductor device, and extend in the X-direction parallel to each other. The insulation layers form isolation structures 1304 and 1314 as well as inner spacers 1310 and 1320.

Each of the trenches is filled with an insulating material (e.g., $SiO_2$, SiN, SiON, SiCN, SiC, SiOC, SiOCN, any other suitable material, or combinations thereof) so as to form the insulation layer. In some embodiments, the insulation layer may be formed from the same material as the plurality of insulating layers 118 (e.g., $SiO_2$). The insulation layer may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Thus, a plurality of partially formed memory cells 1302 that include the memory layers 1102 and 1112, the semiconductor channels 1202A-1212F, and the insulation layer are formed in the semiconductor device 300 and extend in the X-direction parallel to each other.

The cavities filled with the insulation layer in between the partially formed memory cells 1302 form the isolation structures 1304 and 1314. The isolation structures 1304 and 1314 separate the semiconductor channels 1202A-1212F into portions such that the semiconductor channels 1202A-1212F are included in each partially formed memory cell 1302.

Each memory cell 1302 includes an inner spacer 1310 or 1320 formed from a portion of the insulation layer extending between adjacent isolation structures 1304 or 1314 in the X-direction. The semiconductor channels 1202A-1212F are disposed on outer surfaces of the inner spacers 1310 or 1320 in the X-direction. A CMP process may then be performed after forming the insulation layer so that it will lie in the same X-Y plane or are level with a top surface of the topmost insulating layer 118.

FIG. 14 illustrates second device segments 1408 and 1410 formed between the first device segments 1402, 1404, and 1406. Each of the second device segments 1408 and 1410 is similar in structure to the first device segments 1402, 1404, and 1406 and include the memory layers 1102 and 1112, the semiconductor channel layers 1202A-1212F, the isolation structures 1304 and 1314, and the inner spacers 1310 and 1320. The second device segments 1408 and 1410 extend in the X-direction parallel to each other with the first device segment 1404 interposed between a pair of second device segments 1408 and 1410. Forming the first and second device segments 1402-1410 allows adjacent insulating layers 118 in the stack 116 to always be supported by either the sacrificial layers 324 during formation of the word lines 502 included in the first device segments 1402, 1404, and 1406, or supported by the word lines 502 of the first device segments 1402, 1404, and 1406 during formation of the second device segments 1408 and 1410, while allowing increase in a device packing density of the semiconductor device 300.

Corresponding to operation 236 of FIG. 2, FIGS. 15A-D are a perspective view of the semiconductor device 300, a top view, a cross-section view cut along a first cross-section (e.g., along the X-direction), and a cross-section view cut across a second cross-section (e.g., along the Y-direction), respectively, in accordance with some embodiments. As shown at least in FIG. the semiconductor device 300 includes a number of source lines 1506, 1510, 1514, 1518, 1522, 1526, 1530, 1534, 1538, 1542, 1546, 1550, 1554, 1558, and 1562 and a number of bit lines 1508, 1512, 1516, 1520, 1524, 1528, 1532, 1536, 1540, 1544, 1548, 1552, 1556, 1560, and 1564 that are formed to form memory cells. In some embodiments, a source line or a bit line may sometimes be collectively referred to as a bit/source line. However, it should be understood that, in some embodiments, the source line and bit line may be coupled to different levels of (e.g., voltage) signals, when operating the semiconductor device.

The inner spacers 910, 920, 930, 1310, and 1320 may be patterned to define initial footprints of a number of source lines and bit lines. The patterning generates trench portions by first etching through axial ends of the inner spacers 910, 920, 930, 1310, and 1320 to the substrate 301. The axial ends of the inner spacers 910, 920, 930, 1310, and 1320 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Next, the source lines 1506-1562 and the bit lines 1508-1564 may be formed, for example, using an epitaxial layer growth process to fill the trench portions with a metal material such that the source lines 1506-1562 and the bit lines 1508-1564 are located on opposite axial ends of the inner spacers 910-930 and 1310-1320, each extending from the substrate 301 to a top surface of the inner spacers 910-930 and 1310-1320, as shown in FIG. The source lines 1506-1562 and the bit lines 1508-1564 may be formed in contact with end portions of a sidewall of the semiconductor channels 702A-F, 712A-F, 722A-F, 1202A-F, and 1212A-F. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, other suitable materials, or combinations thereof. Other metal materials are within the scope of the present disclosure. The source lines 1506-1562 and bit lines 1508-1564 can be formed by overlaying the workpiece (e.g., to fill the recesses) with the above-listed metal material by, for example, chemical vapor deposition (CVD), physical vapor deposition (PVD), electroless plating, electroplating, other suitable processes, or combinations thereof. In some embodiments, a control deposition step may be performed for forming the source lines 1506-1562 and the bit lines 1508-1564 such that the deposition step is stopped when a height of the source lines 1506-1562 and the bit lines 1508-1564 in the Z-direction are equal to a height of the stack 116. In other embodiments, a CMP operation may be performed after formation of the source lines 1506-1562 and the bit lines 1508-1564 so as to ensure a top surface of each of the topmost insulating layer 118, the memory layers 602, 612, 622, 1102, and 1112, the semiconductor channels 702A-722F and 1202A-1212F, the inner spacers 910-930 and 1310-1320, the source lines 1506-1562, and the bit lines 1508-1564 lie in the same X-Y plane or are level with a top surface of the topmost insulating layer 118. In other embodiments, a top surface of the source lines 1506-1562 and the bit lines 1508-1564 may be higher than a top surface of the topmost insulating layer 118. In some other embodiments, the top surface of the source lines 1506-1562 and the bit lines 1508-1564 may be lower than the top surface of the topmost insulating layer 118.

FIG. 15B is the top view of two memory cells 1602 and 1604, each of which may be comprised of one word line, one source line, one bit line, a portion of a semiconductor channel, and a portion of a memory layer. The memory cell 1602 is one memory cell from the semiconductor device 300 and comprises a portion of the word line 502A, the source line 1506, the bit line 1508, a portion of the semiconductor channel 702A, and a portion of the memory layer 602A. The memory cell 1604 is another memory cell from the semiconductor device 300 and comprises a portion of the word line 502B, the source line 1506, the bit line 1508, a portion of the semiconductor channel 702B, and a portion of the memory layer 602B. Li is defined as the length of the inner spacer 910 in the between the source line 1506 and the bit line 1508 in the X-direction. It is understood that semiconductor devices are not limited to the number of memory cells shown on semiconductor device 300.

FIG. 15C is a cross-section view of the semiconductor device 300 that illustrates the source line 1506 and the bit line 1508 and the alternating word lines 502 and insulating layers 118 taken across the cross-section X-X along the X-direction. Multiple memory cells such as but not limited to 1602 and 1604 can form respective channel lengths of memory cells arranged along a vertical direction (which are sometimes referred to as a memory string).

The dotted lines illustrate that the alternating word lines 502 and the insulating layers 118 are in a plane behind the source line 1506 and the bit line 1508. For the purposes of clarity, the source line 1506, the bit line 1508, and the word lines 502 are depicted in the same plane. As shown in FIG. 15C, the source line 1506 and the bit line 1508 extend along the Z-direction. The source line 1506 and the bit line 1508 are spaced apart from each other along the X-direction. A plurality of word lines 502 alternating with insulating layers 118 extend along the X-direction and are disposed across the source line 1506 and the bit line 1508. The varying width of the source line 1506 and the bit line 1508 result in a varying channel length in the memory string. For example, the topmost channel length is $Lx_1$, and the bottommost channel length is $Lx_2$. In some embodiments, the channel length $Lx_1$ may be less than the channel length $Lx_2$. In such embodiments, the channel lengths between the bottommost channel length $Lx_2$ and the topmost channel length $Lx_1$ decrease in length along an increasing height in the Z-direction.

Figure 15A:
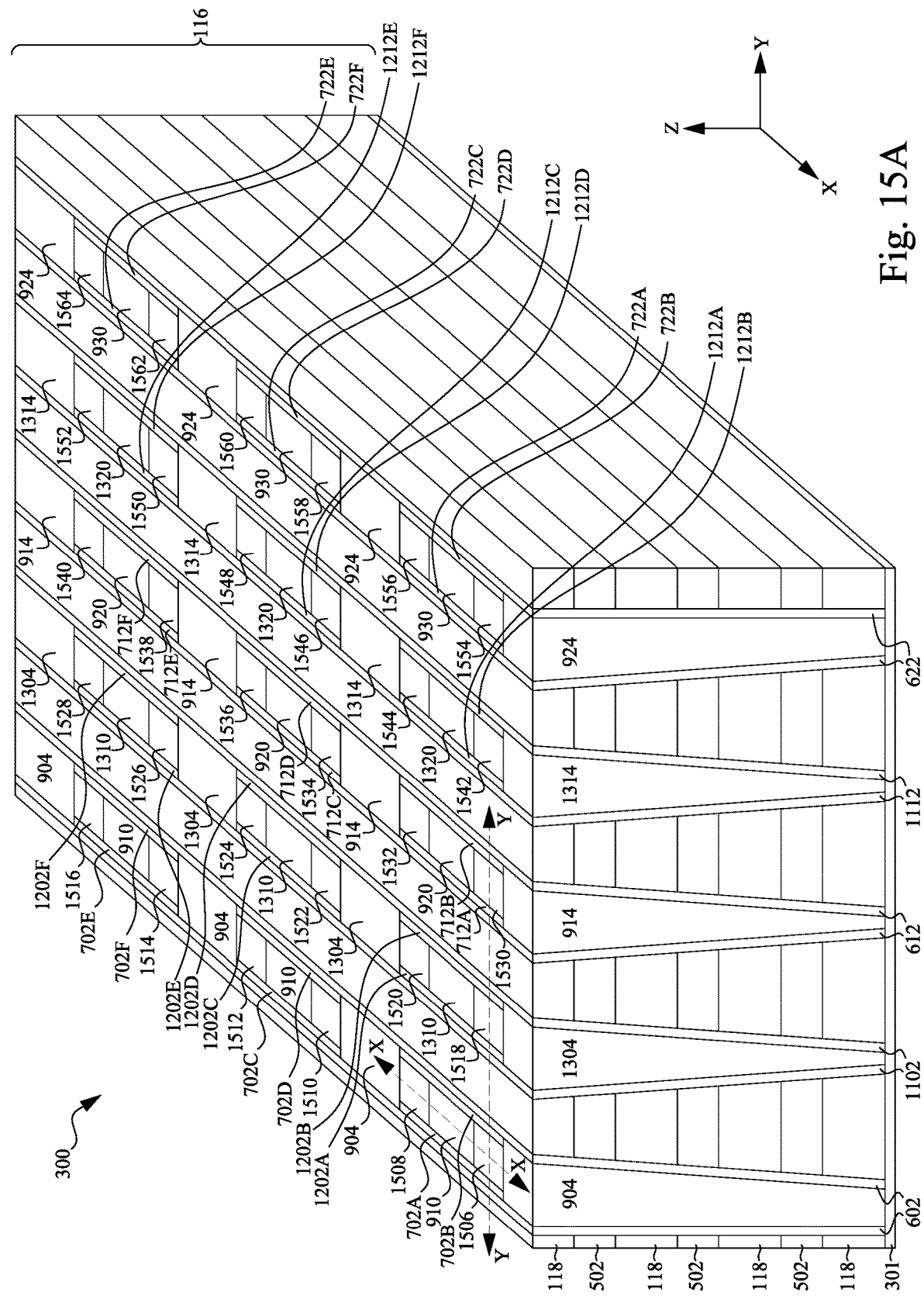
Figure 15D:
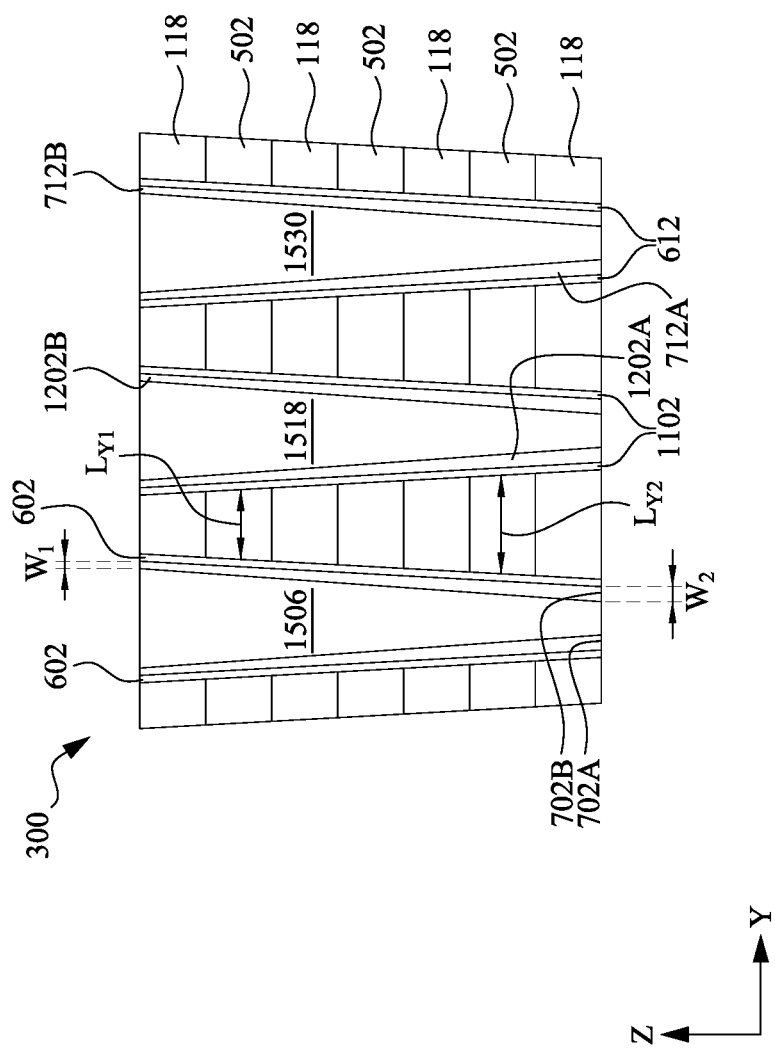

FIG. 15D is a cross-section view of the semiconductor device 300 that illustrates the varying width of the semiconductor channels 702A-B, 1202A-B, and 712A-B taken along the cross-section Y-Y along the Y-direction, in accordance with some embodiments.

As shown in FIG. 15D, the width of each of the semiconductor channels 702A-B, 1202A-B, and 712A-B along the Y-direction (i.e., their thickness) decreases with an increasing height along the Z-direction. For example, the width of the semiconductor channel 702B is defined as $W_1$ at the top of the semiconductor device 300 and $W_2$ at the bottom of the semiconductor device 300 near the substrate. Similar widths are observed for the semiconductor channels 702A, 1202A, 1202B, 712A, and 712B. In some embodiments, $W_1$ is less than $W_2$, as shown in FIG. 15D. The varying width of the semiconductor channels 702A-B, 1202A-B, and 712A-B can make cell current increase with increasing channel lengths such as $Lx_1$ and $Lx_2$ (FIG. 15C) to provide a constant cell current throughout the memory strings. The lengths of the word lines in the second lateral direction ($Ly_1$ and $Ly_2$) result from the formation of the first trenches 426 and the second trenches 1026. These lengths may not correspond to the channel lengths $Lx_1$ and $Lx_2$ shown in FIG. 15C.

Figure 16A:
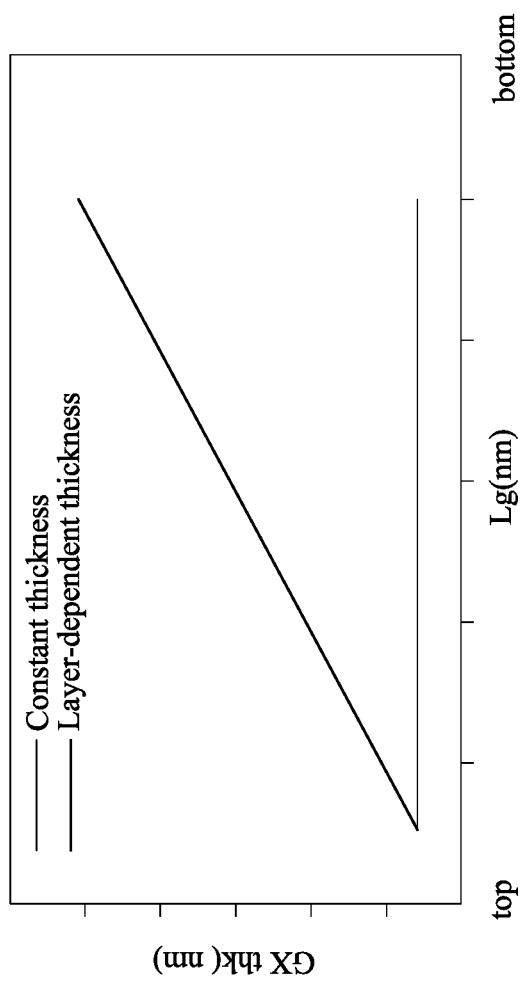
FIGS. 16A-B are plots of semiconductor channel thickness versus channel length and a cell current versus channel length, respectively, of the example semiconductor device of FIGS. 15A-D, in accordance with some embodiments.
Figure 16B:
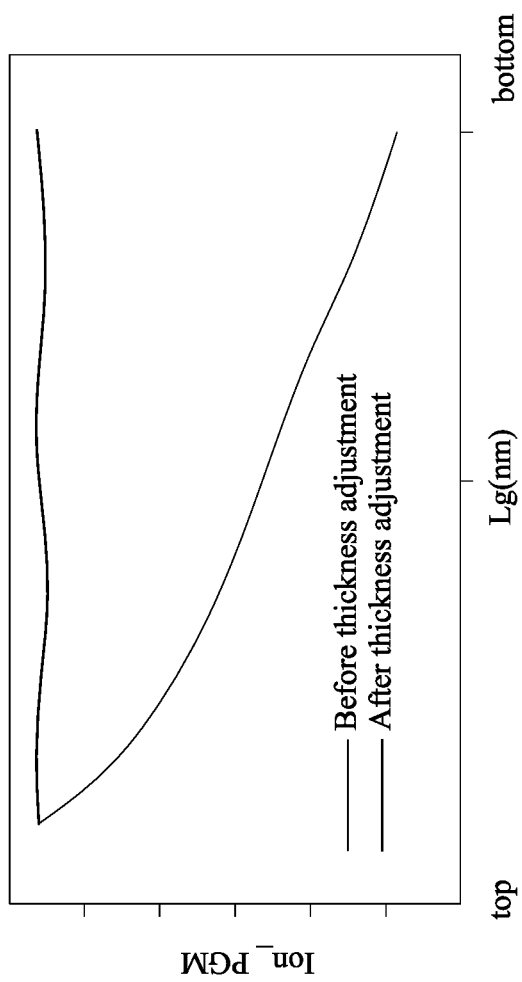

FIGS. 16A-B illustrate plots of semiconductor channel thickness versus channel length and cell current versus channel length, respectively, that correspond to the embodiment of the semiconductor device 300 shown in FIGS. 15A-D.

FIG. 16A illustrates that the semiconductor channel thickness directly corresponds to the channel length for this embodiment, in comparison to constant thickness of semiconductor channel thickness typically observed in this field. From top to bottom, the channel length increases, and the semiconductor channel thickness increases accordingly. FIG. 16B demonstrates that the word line layer-dependent thickness results in a constant cell current, in comparison to the degradation of cell current typically observed along longer channel lengths.

FIGS. 17A-B are cross-section views of a semiconductor device 400 with a source line 1706 and a bit line 1708 that have varying widths that decreases in a first portion 1700A and increases in a second portion 1700B with an increasing height along the vertical direction (e.g., the Z-direction), cut along the X-direction and the Y-direction, respectively, in accordance with some embodiments.

The semiconductor device 400 is formed from the method 200 from FIG. 2. The semiconductor device 400 is substantially similar to the semiconductor device 300 but with a decreasing varying width of the bit lines and the source lines in a first portion and an increasing varying width of the bit lines and source lines in a second portion along an increasing height of the semiconductor device 400 along the Z-direction. In contrast, the semiconductor device 300 has a continuously increasing varying width of the bit lines and the source lines along an increasing height of the semiconductor device 300.

FIG. 17A is a cross-section view of the semiconductor device 400 with the first portion 1700A and the second portion 1700B along an increasing height of the semiconductor device 400 in the Z-direction, cut along the X-direction.

The semiconductor device 400 comprises the source line 1706, the bit line 1708, the alternating word lines 1702 and insulating layers 1718 which are substantially similar to the source line 1506, the bit line 1508, and the alternating word lines 502 and insulating layers 118 of the semiconductor device 300 in FIG. 15C. As shown in FIG. 17A, the width of the source line 1706 and the bit line 1708 decrease with an increasing height along the first portion 1700A. The width of the source line 1706 and bit line 1708 increase with an increasing height along the second portion 1700B. The varying width of the source line 1706 and the bit line 1708 result in a varying channel length. For example, the topmost channel length is $Lx_1$, the bottommost channel length is $Lx_2$, and the channel length at the point where the first portion 1700A meets the second portion 1700B is $Lx_3$. In some embodiments, the channel length $Lx_3$ is greater than the channel lengths $Lx_1$ and $Lx_2$. In some embodiments, the channel length $Lx_1$ is equal to the channel length $Lx_2$. In some embodiments, the channel lengths between the bottommost channel length $Lx_2$ and the channel length $Lx_3$ increase in length in an increasing height along the Z-direction. In some embodiments, the channel lengths between the channel length $Lx_3$ and the topmost channel length $Lx_1$ decrease in length in an increasing height along the Z-direction.

FIG. 17B is a cross-section view of the semiconductor device 400 with the first portion 1700A and the second portion 1700B along an increasing height of the semiconductor device 400 in the Z-direction, cut along the Y-direction.

The semiconductor device 400 further comprises the memory layers 1802 and 1812 and the semiconductor channels 1822A-B and 1832A-B which are substantially similar to the memory layers 602 and 1102 and the semiconductor channels 702A-B and 1202A-B of semiconductor device 300 in FIG. 15D. The semiconductor device 400 further comprises another source line 1818 substantially similar to the source line 1518 in semiconductor device 300 shown in FIG. 15D.

The semiconductor channels 1822A-B and 1832A-B have a varying width that increases along the first portion 1700A and decreases along the second portion 1700B with an increasing height in the Z-direction. The widths of the semiconductor channels 1822A-B and 1832A-B are defined as $W_1$ at the top of the semiconductor device 400, $W_2$ at the bottom of the semiconductor device 400 near the substrate, and $W_3$ at the point of the semiconductor device in between the first portion 1700A and the second portion 1700B. In some embodiments, both $W_1$ and $W_2$ are less than $W_3$ as shown in FIG. 17B. In some embodiments, $W_1$ is equal to $W_2$. The varying width of the semiconductor channels 1822A-B and 1832A-B are designed to make cell current increase or remain constant with varying channel lengths. The length of the word lines 1702 in the Y-direction, $Ly_1$, $Ly_2$, and $Ly_3$, result from the formation of the trenches. These lengths do not affect the channel lengths $Lx_1$, $Lx_2$, and $Lx_3$ shown in FIG. 17A.

Figure 18A:
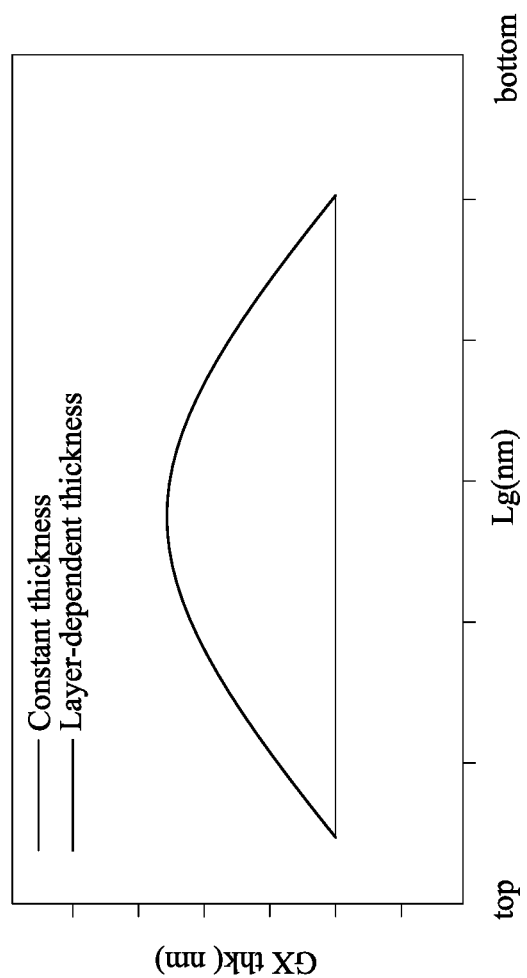
FIGS. 18A-B are plots of a semiconductor channel thickness versus channel length and a cell current versus channel length, respectively, of the example semiconductor device of FIGS. 17A-B, in accordance with some embodiments.
Figure 18B:
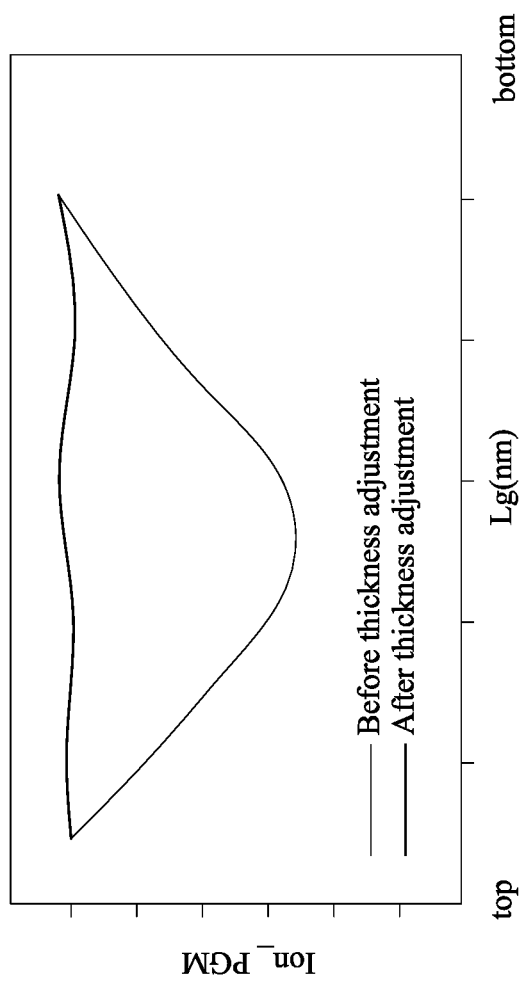

FIGS. 18A-B illustrate plots of semiconductor channel thickness versus channel length and cell current versus channel length that correspond to the embodiment of the semiconductor device 400 shown in FIGS. 17A-B.

FIG. 18A illustrates that the semiconductor channel thickness directly corresponds to the channel length for this embodiment, in comparison to constant thickness of semiconductor channel thickness typically observed in this field. FIG. 18B demonstrates that the channel length layer-dependent thickness of the semiconductor channel results in a constant cell current, in comparison to the degradation of cell current typically observed along longer channel lengths.

FIGS. 19A-B are cross-section views of a semiconductor device 500 with a source line 1906 and a bit line 1908 that have varying widths that increases in a first portion 1900A and decreases in a second portion 1900B with increasing height along the Z-direction, cut along the X-direction and the Y-direction, respectively, in accordance with some embodiments.

The semiconductor device 500 is formed from the method 200 from FIG. 2. The semiconductor device 500 is substantially similar to the semiconductor device 300 but with an increasing varying width of the bit lines and the source lines in a first portion and a decreasing varying width of the bit lines and source lines in a second portion along an increasing height of the semiconductor device 500 along the Z-direction. In contrast, semiconductor device 300 has a continuously increasing varying width of the bit lines and the source lines along an increasing height of the semiconductor device 300.

FIG. 19A is a cross-section view of the semiconductor device 500 with the first portion 1900A and the second portion 1900B along an increasing height of the semiconductor device 400 in the Z-direction, cut along the X-direction.

The semiconductor device 500 comprises the source line 1906, the bit line 1908, the alternating word lines 1902 and insulating layers 1918 which are substantially similar to the source line 1506, the bit line 1508, and the alternating word lines 502 and insulating layers 118 of the semiconductor device 300 in FIG. 15C. As shown in FIG. 19A, the width of the source line 1906 and the bit line 1908 increase with an increasing height along the first portion 1900A. The width of the source line 1906 and bit line 1908 decrease with an increasing height along the second portion 1700B. The varying width of the source line 1906 and the bit line 1908 result in a varying channel length. For example, the topmost channel length is $Lx_1$, the bottommost channel length is $Lx_2$, and channel length at the point where the first portion 1900A meets the second portion 1900B is $Lx_3$. In some embodiments, the channel length $Lx_3$ is less than the channel lengths $Lx_1$ and $Lx_2$. In some embodiments, the channel length $Lx_1$ is equal to the channel length $Lx_2$. In such embodiments, the channel lengths between the bottommost channel length $Lx_2$ and the channel length $Lx_3$ increase in length with an increase in height along the Z-direction. In such embodiments, the channel lengths in between the channel length $Lx_3$ and the topmost channel length $Lx_1$ decrease in length along the Z-direction.

FIG. 19B is a cross-section view of the semiconductor device 500 with the first portion 1900A and the second portion 1900B along an increasing height of the semiconductor device 500 in the Z-direction, along the Y-direction.

The semiconductor device 500 further comprises the memory layers 2002 and 2012 and the semiconductor channels 2022A-B and 2032A-B which are substantially similar to the memory layers 602 and 1102 and the semiconductor channels 702A-B and 1202A-B of semiconductor device 300 in FIG. 15D. The semiconductor device 500 further comprises another source line 2018 substantially similar to the source line 1518 in semiconductor device 300 shown in FIG. 15D.

The semiconductor channels 2022A-B and 2032A-B have a varying width that decrease along the first portion 1900A and increase along the second portion 1900B with increasing height in the Z-direction. The widths of the semiconductor channel segments 2022A-B and 2032A-B are defined as $W_1$ at the top of the semiconductor device 500, $W_2$ at the bottom of the semiconductor device 500 near the substrate, and $W_3$ at the point of the semiconductor device in between the first portion 1900A and the second portion 1900B. In some embodiments, both $W_1$ and $W_2$ are greater than $W_3$ as shown in FIG. 19B. In some embodiments, $W_1$ is equal to $W_2$. The varying width of the semiconductor channel segments 2022A-B and 2032A-B are designed to keep cell current constant with varying channel lengths. The length of the word lines 1902 in the Y-direction, $Ly_1$, $Ly_2$, and $Ly_3$, result from the formation of the trenches. These lengths do not affect the channel lengths $Lx_1$, $Lx_2$, and $Lx_3$ shown in FIG. 19A.

Figure 20A:
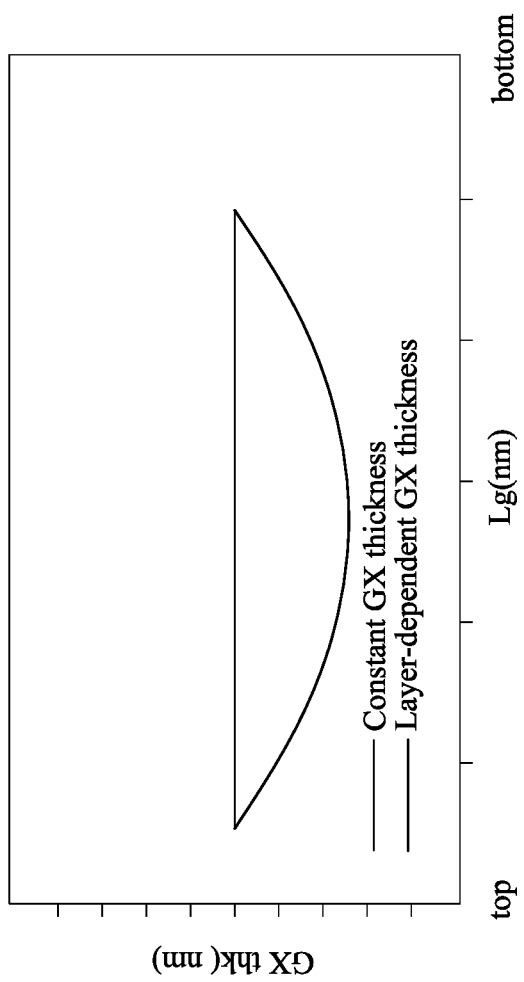
FIGS. 20A-B are plots of a semiconductor channel thickness versus a channel length and a cell current versus channel length, respectively, of the example semiconductor device of FIGS. 19A-B, in accordance with some embodiments.
Figure 20B:
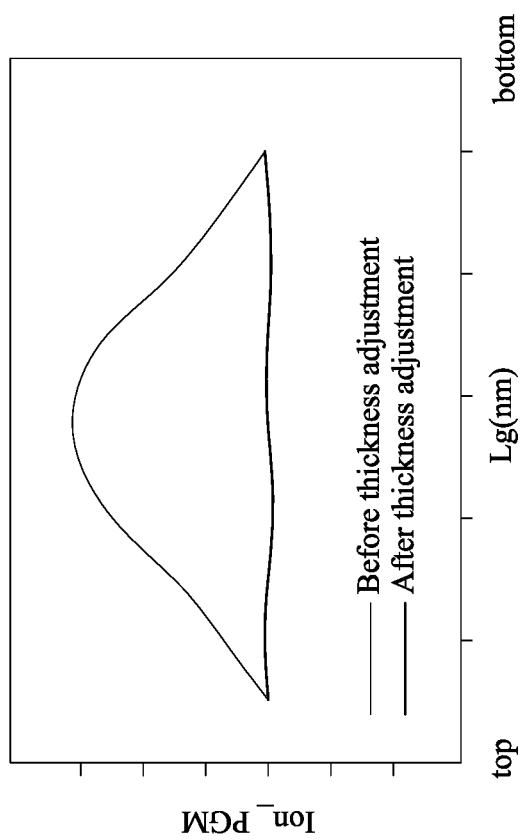

FIGS. 20A-B illustrate plots of semiconductor channel thickness versus channel length and cell current versus channel length that correspond to the embodiment of the semiconductor device 500 shown in FIGS. 19A-B.

FIG. 20A illustrates that the semiconductor channel thickness directly corresponds to the channel length for this embodiment, in comparison to constant thickness of semiconductor channel thickness typically observed in this field. FIG. 20B demonstrates that the channel length layer-dependent thickness of the semiconductor channel results in a constant cell current, in comparison to the degradation of cell current typically observed along longer channel lengths.

Figure 21A:
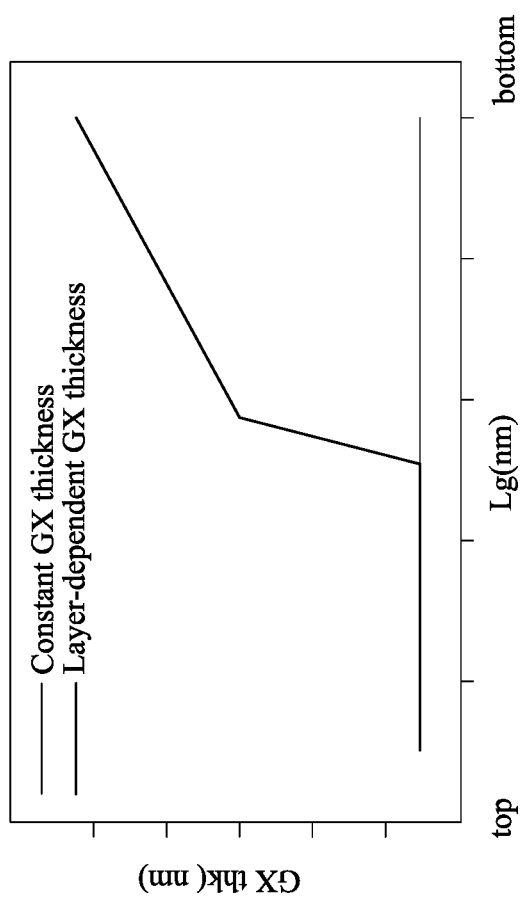
FIGS. 21A, 21B, 22A, 22B, 23A, and 23B are plots of semiconductor channel thickness versus channel length and a cell current versus channel length of example semiconductor devices, in accordance with some embodiments.
Figure 21B:
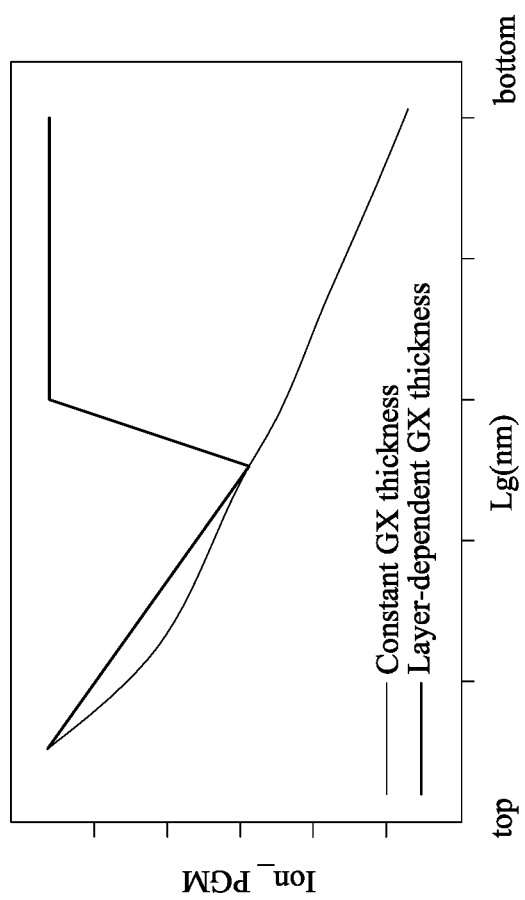
Figure 22A:
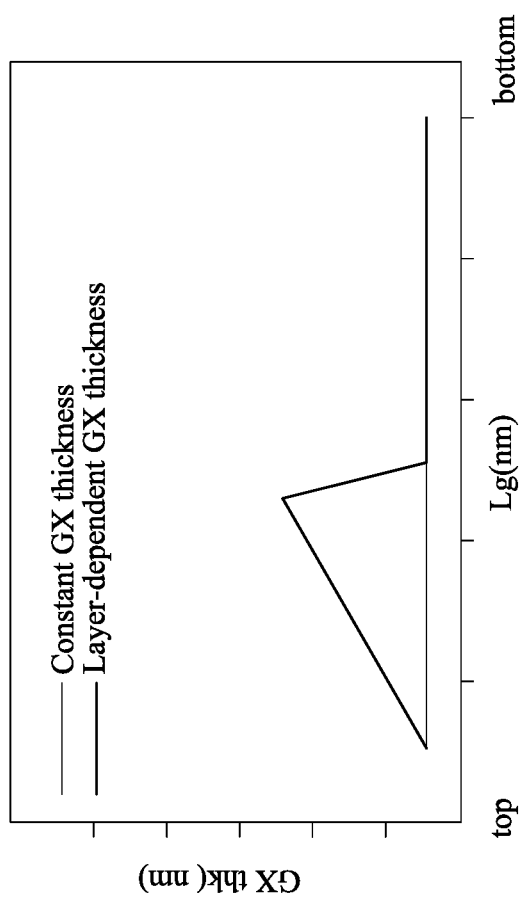
Figure 22B:
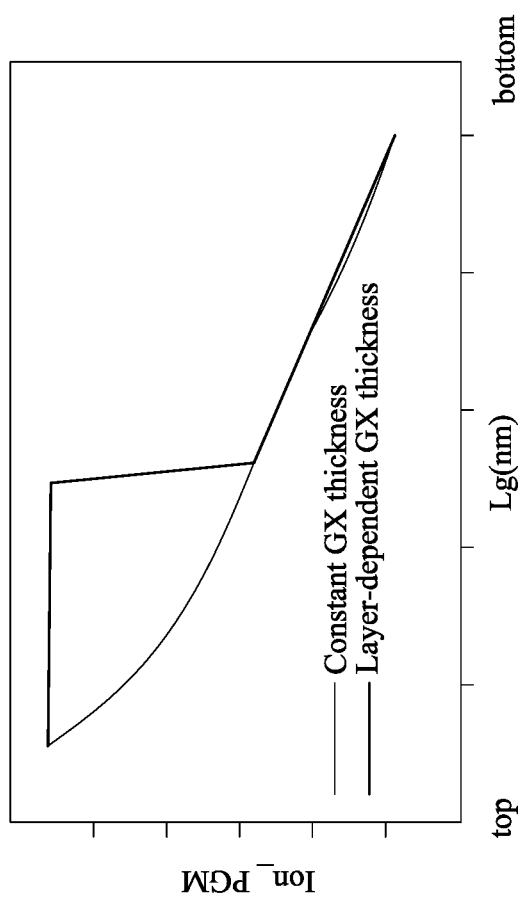
Figure 23A:
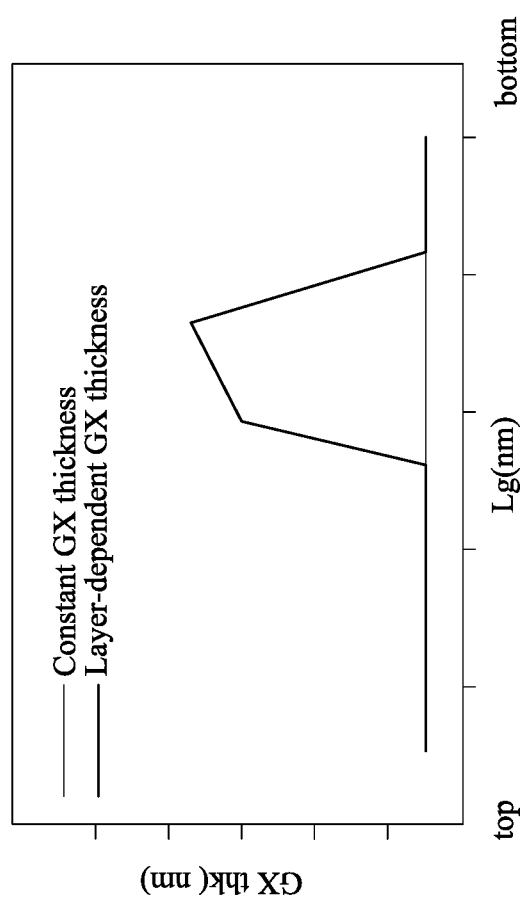
Figure 23B:
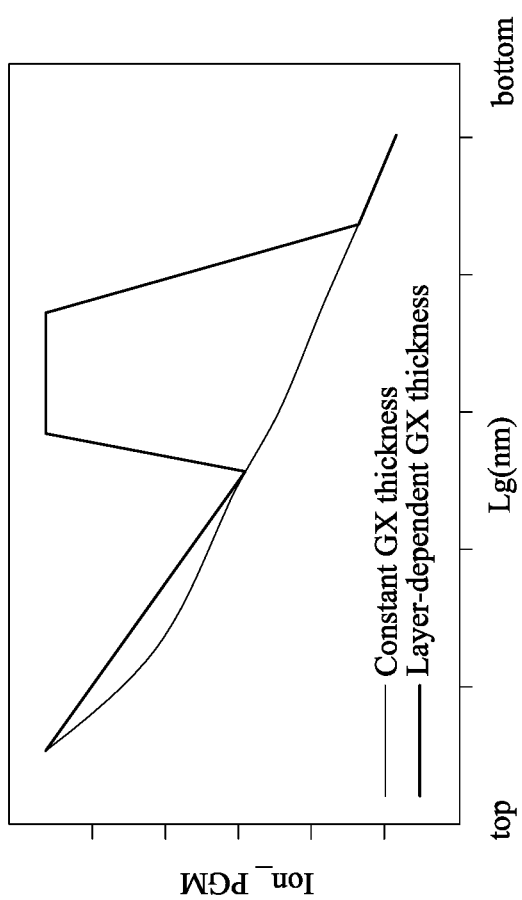

FIGS. 21A-23B illustrate various plots of designing the semiconductor channel thickness to correspond to channel length and the effect on cell current. Therefore, the present invention is not limited to the embodiments discussed above. FIGS. 21A, 22A, and 23A are plots of the channel doping concentration as a result of channel length with a layer-dependent semiconductor channel thickness. FIGS. 21B, 22B, and 23B are plots of the cell current as a result of channel length that correspond to FIGS. 21A, 22A, and 23A, respectively. FIGS. 21A-23B further demonstrate that modifying semiconductor channel thickness to correspond to the channel length compensates for the loss of cell current typically seen in semiconductor devices. Furthermore, the thickness of the semiconductor channel does not need to increase or decrease continuously throughout the semiconductor device and can be modified according to the desired outcome.

In one aspect of the present disclosure, a semiconductor device is disclosed. The semiconductor device includes a first conductive structure extending along a vertical direction and a second conductive structure extending along the vertical direction, wherein the second conductive structure is spaced apart from the first conductive structure along a first lateral direction. The semiconductor device includes a plurality of third conductive structures each extending along the first lateral direction, wherein the plurality of third conductive structures are disposed across the first and second conductive structures. The semiconductor device includes a first semiconductor channel extending along the vertical direction. The first semiconductor channel is disposed between the plurality of third conductive structures and the first conductive structure, and between the plurality of third conductive structures and the second conductive structure. The first and second conductive structures each have a first varying width along the first lateral direction, and the first semiconductor channel has a second varying width along a second lateral direction, the second lateral direction perpendicular to the first lateral direction.

In another aspect of the present disclosure, a memory device is disclosed. The memory device includes a first bit/source line extending along a vertical direction and a second bit/source line extending along the vertical direction. The memory device includes a first word line extending along a first lateral direction. The memory device includes a first memory film extending along the vertical direction, the first memory film in contact with the first word line. The memory device includes a first semiconductor channel extending along the vertical direction, the first semiconductor channel disposed between the first bit/source line and the first memory film. The first and second bit/source lines each have a first width extending along the first lateral direction, the first width increasing with an increasing height of the bit/source line. The first semiconductor channel has a second width extending along a second lateral direction, the second width decreasing with an increasing height of the first semiconductor channel. The second lateral direction is perpendicular to the first lateral direction.

In yet another aspect of the present disclosure, a method for fabricating memory devices is disclosed. The method includes providing a stack comprising a plurality of insulating layers and a plurality of sacrificial layers alternatively arranged on top of one another. The method includes forming a trench extending through the stack in a first lateral direction. The method includes replacing portions of the plurality of sacrificial layers with a plurality of first conductive structures, respectively, wherein the plurality of first conductive structures each extend in the first lateral direction. The method includes forming a semiconductor channel extending along each sidewall of the trench, wherein the semiconductor channel has a varying width, extending along a second lateral direction, where the varying width decreases with an increasing height of the semiconductor channel. The method includes forming a second conductive structure and a third conductive structure extending along a vertical direction, wherein the second and third conductive structures are in contact with end portions of a sidewall of the semiconductor channel, respectively.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first semiconductor channel extending along a vertical direction and a first lateral direction;
a first conductive structure extending along the vertical direction and in contact with one end of the first semiconductor channel along the first lateral direction; and
a second conductive structure extending along the vertical direction and in contact with the other end of the first semiconductor channel along the first lateral direction;
wherein the first semiconductor channel has a first width along a second lateral direction perpendicular to the first lateral direction, and the first width varies in accordance with an increasing height of the first semiconductor channel.

2. The semiconductor device of claim 1, wherein the first conductive structure and the second conductive structure each have a second width along the second lateral direction, and wherein the second width varies in accordance with an increasing height of the first and second conductive structures.

3. The semiconductor device of claim 2, wherein the second width increases with the increasing height of the first and second conductive structures, while the first width decreases with the increasing height of the first semiconductor channel.

4. The semiconductor device of claim 2, wherein the second width having a first portion increases and a second portion decreases, with the increasing height of the first and second conductive structures, while the first width having a first portion decreases and a second portion increases with the increasing height of the first semiconductor channel.

5. The semiconductor device of claim 2, wherein the first width having a first portion decreases and a second portion increases, with the increasing height of the first and second conductive structures, while the second width having a first portion increases and a second portion decreases with the increasing height of the first semiconductor channel.

6. The semiconductor device of claim 1, further comprising:
 a plurality of third conductive structures each extending along the first lateral direction, wherein the plurality of third conductive structures are spaced form one another along the vertical direction; and
 a first memory film extending along the vertical direction and disposed between the first semiconductor channel and the plurality of third conductive structures.

7. The semiconductor device of claim 6, wherein each of the plurality of third conductive structures, the first conductive structure, the second conductive structure, a portion of the first semiconductor channel, and a portion of the first memory film collectively operate as a first memory cell.

8. The semiconductor device of claim 7, further comprising:
 a plurality of fourth conductive structures each extending along the first lateral direction, wherein the plurality of fourth conductive structures are disposed across the first and second conductive structures;
 a second semiconductor channel extending along the vertical direction, wherein the second semiconductor channel is disposed between the plurality of fourth conductive structures and the first conductive structure, and between the plurality of fourth conductive structures and the second conductive structure; and
 a second memory film extending along the vertical direction and disposed between the second semiconductor channel and the plurality of fourth conductive structures;
 wherein the second semiconductor channel also has the first width along the second lateral direction.

9. The semiconductor device of claim 8, wherein each of the plurality of fourth conductive structures, the first conductive structure, the second conductive structure, a portion of the second semiconductor channel, and a portion of the second memory film collectively operate as a second memory cell.

10. The semiconductor device of claim 8, wherein the first and second memory film each include a ferroelectric layer.

11. A semiconductor device, comprising:
 a semiconductor channel extending along a vertical direction and a first lateral direction;
 a first conductive structure extending along the vertical direction and electrically coupled to the semiconductor channel; and
 a second conductive structure extending along the vertical direction and electrically coupled to the semiconductor channel;
 wherein the semiconductor channel has a first width along a second lateral direction perpendicular to the first lateral direction, and the first width varies in accordance with an increasing height of the semiconductor channel.

12. The semiconductor device of claim 11, wherein the first conductive structure is in contact with one end of the semiconductor channel along the first lateral direction, and the second conductive structure is in contact with the other end of the semiconductor channel along the first lateral direction.

13. The semiconductor device of claim 11, further comprising:
 a plurality of third conductive structures each extending along the first lateral direction, wherein the plurality of third conductive structures are spaced form one another along the vertical direction; and
 a memory film extending along the vertical direction and disposed between the semiconductor channel and the plurality of third conductive structures.

14. The semiconductor device of claim 13, wherein the plurality of third conductive structures, the first conductive structure, the second conductive structure, the semiconductor channel, and a portion of the memory film collectively operate as a plurality of memory cells.

15. The semiconductor device of claim 13, wherein the memory film includes a ferroelectric layer.

16. The semiconductor device of claim 11, wherein the first conductive structure and the second conductive structure each have a second width along the second lateral direction, and wherein the second width varies in accordance with an increasing height of the first and second conductive structures.

17. The semiconductor device of claim 16, wherein the second width increases with the increasing height of the first and second conductive structures, while the first width decreases with the increasing height of the semiconductor channel.

18. A semiconductor device, comprising:
 a semiconductor channel extending along a vertical direction and a first lateral direction;
 a bit line extending along the vertical direction and electrically coupled to the semiconductor channel;
 a source line extending along the vertical direction and electrically coupled to the semiconductor channel; and
 a word line extending along a first lateral direction and electrically coupled to the semiconductor channel through a memory film;
 wherein the semiconductor channel has a first width along a second lateral direction perpendicular to the first lateral direction, and the first width varies in accordance with an increasing height of the semiconductor channel.

19. The semiconductor device of claim 18, wherein the memory film includes a ferroelectric layer.

20. The semiconductor device of claim 18, wherein the bit line and the source line each have a second width along the second lateral direction, and wherein the second width varies in accordance with an increasing height of the bit line and the source line.

* * * * *